(12) United States Patent
Pandev et al.

(10) Patent No.: US 10,732,516 B2
(45) Date of Patent: Aug. 4, 2020

(54) PROCESS ROBUST OVERLAY METROLOGY BASED ON OPTICAL SCATTEROMETRY

(71) Applicant: KLA-Tencor Corporation, Milpitas, CA (US)

(72) Inventors: Stilian Ivanov Pandev, Santa Clara, CA (US); Andrei V. Shchegrov, Campbell, CA (US); Wei Lu, Fremont, CA (US)

(73) Assignee: KLA Tencor Corporation, Milpitas, CA (US)

( * ) Notice: Subject to any disclaimer, the term of this patent is extended or adjusted under 35 U.S.C. 154(b) by 0 days.

(21) Appl. No.: 15/861,938

(22) Filed: Jan. 4, 2018

(65) Prior Publication Data
US 2018/0252514 A1    Sep. 6, 2018

Related U.S. Application Data

(60) Provisional application No. 62/465,163, filed on Mar. 1, 2017.

(51) Int. Cl.
*G03F 7/20* (2006.01)
*G01B 11/14* (2006.01)

(52) U.S. Cl.
CPC ......... *G03F 7/70633* (2013.01); *G01B 11/14* (2013.01); *G03F 7/70616* (2013.01)

(58) Field of Classification Search
CPC . G01B 11/14; G03F 7/70616; G03F 7/70625; G03F 7/70633

(Continued)

(56) References Cited

U.S. PATENT DOCUMENTS

| 5,608,526 A | 3/1997 | Piwonka-Corle et al. |
| 5,859,424 A | 1/1999 | Norton et al. |

(Continued)

OTHER PUBLICATIONS

Bringoltz, Barak, et al., "Accuracy in optical overlay metrology," Metrology, Inspection, and Process Control for Microlithography XXX, Proc. of SPIE, vol. 9778, 97781H, 2016.

(Continued)

*Primary Examiner* — Gordon J Stock, Jr.
(74) *Attorney, Agent, or Firm* — Spano Law Group; Joseph S. Spano

(57) ABSTRACT

Methods and systems for robust overlay error measurement based on a trained measurement model are described herein. The measurement model is trained from raw scatterometry data collected from Design of Experiments (DOE) wafers by a scatterometry based overlay metrology system. Each measurement site includes one or more metrology targets fabricated with programmed overlay variations and known process variations. Each measurement site is measured with known metrology system variations. In this manner, the measurement model is trained to separate actual overlay from process variations and metrology system variations which affect the overlay measurement. As a result, an estimate of actual overlay by the trained measurement model is robust to process variations and metrology system variations. The measurement model is trained based on scatterometry data collected from the same metrology system used to perform measurements. Thus, the measurement model is not sensitive to systematic errors, aysmmetries, etc.

32 Claims, 10 Drawing Sheets

(58) Field of Classification Search
USPC ..... 356/399–401; 430/5, 22, 30; 355/53, 55, 355/77; 250/548; 382/141
See application file for complete search history.

(56) References Cited

U.S. PATENT DOCUMENTS

| | | | |
|---|---|---|---|
| 6,429,943 B1 | 8/2002 | Opsal et al. | |
| 6,633,831 B2 | 10/2003 | Nikoonahad et al. | |
| 6,734,967 B1 | 5/2004 | Piwonka-Corle et al. | |
| 6,816,570 B2 | 10/2004 | Janik et al. | |
| 6,895,075 B2 | 5/2005 | Yokhin et al. | |
| 6,972,852 B2 | 12/2005 | Opsal et al. | |
| 7,385,699 B2 | 6/2008 | Mieher et al. | |
| 7,478,019 B2 | 1/2009 | Zangooie et al. | |
| 7,826,071 B2 | 11/2010 | Shchegrov et al. | |
| 7,873,585 B2* | 1/2011 | Izikson | G05B 13/027 706/21 |
| 7,929,667 B1 | 4/2011 | Zhuang et al. | |
| 7,933,026 B2 | 4/2011 | Opsal et al. | |
| 8,321,821 B2* | 11/2012 | Ku | G03F 7/70633 356/328 |
| 8,666,703 B2* | 3/2014 | Ferns | G03F 7/70616 700/108 |
| 8,843,875 B2 | 9/2014 | Pandev | |
| 8,879,073 B2* | 11/2014 | Madsen | G01B 11/0625 356/446 |
| 9,093,458 B2* | 7/2015 | Amir | H01L 23/544 |
| 9,127,927 B2* | 9/2015 | Iloreta | G03F 7/70625 |
| 9,175,951 B2* | 11/2015 | El Gawhary | G01B 11/24 |
| 9,412,673 B2* | 8/2016 | Kim | G03F 7/70616 |
| 9,607,265 B2* | 3/2017 | Jin | G06N 3/08 |
| 10,101,670 B2* | 10/2018 | Pandev | G03F 7/70558 |
| 10,152,678 B2* | 12/2018 | Pandev | G06N 20/00 |
| 10,190,868 B2* | 1/2019 | Lee | G01B 11/02 |
| 10,295,342 B2* | 5/2019 | Pandev | G01B 21/042 |
| 10,325,004 B1* | 6/2019 | Dziura | G01N 21/47 |
| 10,345,095 B1* | 7/2019 | Pandev | H01L 22/20 |
| 10,380,728 B2* | 8/2019 | Pandev | G03F 7/70625 |
| 10,429,320 B2* | 10/2019 | Raquel | G01M 99/008 |
| 2004/0190008 A1* | 9/2004 | Mieher | G01N 21/956 356/625 |
| 2005/0012928 A1 | 1/2005 | Sezginer et al. | |
| 2012/0123581 A1* | 5/2012 | Smilde | G03F 7/70483 700/105 |
| 2012/0206703 A1 | 8/2012 | Bhattacharyya et al. | |
| 2012/0244461 A1 | 9/2012 | Nagai | |
| 2013/0035888 A1* | 2/2013 | Kandel | G03F 7/70633 702/81 |
| 2013/0114085 A1 | 5/2013 | Wang et al. | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0297211 A1 | 10/2014 | Pandev et al. | |
| 2014/0316730 A1 | 10/2014 | Shchegrov et al. | |
| 2015/0042984 A1 | 2/2015 | Pandev et al. | |
| 2015/0046118 A1 | 2/2015 | Pandev et al. | |
| 2015/0176985 A1* | 6/2015 | Shchegrov | H01L 22/12 356/614 |
| 2015/0235108 A1* | 8/2015 | Pandev | G06K 9/6255 382/149 |
| 2015/0323471 A1* | 11/2015 | Sapiens | G01N 21/9501 356/73 |
| 2016/0003609 A1* | 1/2016 | Shchegrov | G03F 7/7065 356/625 |
| 2016/0109375 A1 | 4/2016 | Pandev et al. | |
| 2016/0117812 A1* | 4/2016 | Pandev | G06T 7/0004 382/149 |
| 2016/0117847 A1* | 4/2016 | Pandev | G06T 7/001 348/87 |
| 2016/0146740 A1 | 5/2016 | Yu et al. | |
| 2016/0282105 A1* | 9/2016 | Pandev | G01B 11/0616 |
| 2016/0290796 A1* | 10/2016 | Levy | G01N 21/9501 |
| 2016/0370717 A1* | 12/2016 | Den Boef | G03F 7/70633 |
| 2017/0023491 A1* | 1/2017 | Cao | G01N 21/211 |
| 2017/0061604 A1* | 3/2017 | Pandev | G06T 7/0004 |
| 2019/0086200 A1* | 3/2019 | Amit | G03F 7/70633 |

OTHER PUBLICATIONS

International Search Report dated Jun. 12, 2018, for PCT Application No. PCT/US2018/020342 filed on Mar. 1, 2018 by KLA-Tencor Corporation, 3 pages.

\* cited by examiner

PROCESS ROBUST OVERLAY METROLOGY BASED ON OPTICAL SCATTEROMETRY

CROSS REFERENCE TO RELATED APPLICATION

The present application for patent claims priority under 35 U.S.C. § 119 from U.S. provisional patent application Ser. No. 62/465,163, entitled "Method and System for Process-Robust Overlay Metrology Using Optical Scatterometry," filed Mar. 1, 2017, the subject matter of which is incorporated herein by reference in its entirety.

TECHNICAL FIELD

The described embodiments relate to metrology systems and methods, and more particularly to methods and systems for improved overlay measurement.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition, overlay and other parameters of nanoscale structures.

Semiconductor devices are often fabricated by depositing a series of layers on a substrate. Some or all of the layers include various patterned structures. The relative position of structures both within particular layers and between layers is critical to the performance of completed electronic devices. Overlay refers to the relative position of overlying or interlaced structures on the same or different layers of a wafer. Overlay error refers to deviations from the nominal (i.e., desired) relative position of overlying or interlaced structures. The greater the overlay error, the more the structures are misaligned. If the overlay error is too great, the performance of the manufactured electronic device may be compromised.

Overlay error is typically evaluated based on measurements of specialized target structures formed at various locations on the wafer by a lithography tool. Traditionally, optical metrology techniques have been employed to perform overlay measurements. In some examples, image based overlay (IBO) metrology techniques are employed. IBO measurements involve imaging specialized targets based on reflected light. The target structures may take many forms, such as a box in box structure or bar-in-bar structure. In one example, a box is created on one layer of the wafer and a second, smaller box is created on another layer. The localized overlay error is measured by comparing the alignment between the centers of the two boxes. Such measurements are taken at locations on the wafer where target structures are available. The overlay is measured by processing each image to estimate the distance between target features printed on different layers from the measured images.

Unfortunately, these specialized target structures often do not conform to the design rules of the particular semiconductor manufacturing process being employed to generate the electronic device. This leads to errors in estimation of overlay errors associated with actual device structures that are manufactured in accordance with the applicable design rules. For example, IMO metrology often requires the pattern to have thick lines with critical dimensions far exceeding design rule critical dimensions to be successfully resolved with an optical microscope.

In some other examples, light scattered or diffracted from overlay targets is employed to estimate overlay. Scatterometry based overlay metrology techniques, commonly referred to as scatterometry overlay (SCOL) or diffraction based overlay (DBO), are based primarily on differential measurements of optical signals corresponding to diffraction from two different targets, each with programmed overlay offsets. The unknown overlay error is extracted based on these differential measurements.

Most existing scatterometry based methods characterize overlay error based on a metric sensitive to asymmetry of the structure. For example, existing angle-resolved scatterometry overlay (SCOL) characterizes overlay based on the measured asymmetry between the +1 and −1 diffracted orders. However, relying solely on asymmetry as the indicator of overlay error is problematic because process induced variations, including both symmetric and asymmetric variations, significantly affect the overlay measurement. For example, asymmetric process variations such as sidewall angle asymmetry, line profile asymmetry or beam illumination asymmetry couple into the overlay-generated asymmetry in the measurement signal. This results in an inaccurate measurement of overlay error. In other examples, symmetric process variations such as film thickness variations couple into the overlay-generated asymmetry in the measurement signal.

Traditionally, the lack of robustness to process variations in SCOL and DBO (i.e., changes in non-overlay parameters that affect measured asymmetry) is addressed by selecting a specific illumination wavelength that is less sensitive to process variations and optimizing the target design to reduce sensitivity to process variations. Unfortunately, both of these approaches are limited in their effectivity. For example, the selection of a specific illumination wavelength may result in small overlay measurement errors, but only within a small range of the full process window. This makes the measurement unreliable and inconsistent, requiring frequent reevaluation of illumination wavelength. Target design optimization is very time consuming and requires accurate models of the structures, material dispersions, and the optical system. It is also very challenging to verify the accuracy of the models because the mask and targets are typically not available at the time of recipe development. In addition, target optimization may reduce measurement sensitivity to process variations, but does not fully address robustness to the full window of process variations.

FIGS. 1A-1C illustrate pupil images of one measured diffraction order associated with a SCOL measurement performed at three different illumination wavelengths. FIG. 1A depicts an image 10 of a measured diffraction order at an illumination wavelength of 523 nanometers. FIG. 1B depicts an image 11 of a measured diffraction order at an illumination wavelength of 579 nanometers. FIG. 1C depicts an image 12 of a measured diffraction order at an illumination wavelength of 668 nanometers.

As illustrated in FIG. 1B, the measured image 11 is distorted by an arc through the middle of the image due to resonance at that wavelength. The total intensity of the measured diffraction order is affected by the resonance arc as well as the resulting overlay estimate. Images 10 and 12 do not exhibit such a distortion and the resulting overlay estimates associated with these illumination wavelengths are more accurate.

FIG. 2 depicts a plot 13 of inaccuracy of overlay measurement by a SCOL system over a range of wavelengths. Plotline 14 depicts three different wavelength sub-ranges where overlay inaccuracy spikes to unacceptable levels. Points 15-17 correspond with the illumination wavelengths illustrated in FIGS. 1A-1C, respectively. FIG. 2 is commonly referred to as an inaccuracy landscape. Such a plot is useful for analyzing overlay inaccuracies and robustness to process variations.

A current approach to recipe development for a particular overlay measurement application is to avoid the wavelength sub-regions where inaccuracy spikes. However, the presence of symmetric and asymmetric process variations causes shifts in the inaccuracy landscape which complicates the selection of a suitable illumination wavelength.

FIG. 3 depicts a plot 20 of several inaccuracy landscapes, each associated with a different value of line profile asymmetry. Plotline 21 depicts inaccuracy with no line profile asymmetry. Plotline 22 depicts inaccuracy with line profile asymmetry of 2 nanometers. Plotline 23 depicts inaccuracy with line profile asymmetry of 4 nanometers. Plotline 24 depicts inaccuracy with line profile asymmetry of 8 nanometers. As illustrated in FIG. 3, as structural asymmetry increases, for example, due to printing errors, the amplitude of the induced inaccuracy of the overlay measurement increases. In this example, the increase in inaccuracy is linearly proportional to the amplitude of the line profile asymmetry.

FIG. 4 depicts a plot 30 of several inaccuracy landscapes, each associated with a different value of height variation of the overlay structure, a symmetrical process variation. Plotline 31 depicts inaccuracy with no height variation. Plotline 32 depicts inaccuracy with height variation of +6 nanometers. Plotline 33 depicts inaccuracy with height variation of −6 nanometers. As illustrated in FIG. 4, as the symmetric process variation changes, the inaccuracy landscape shifts in wavelength.

FIGS. 3 and 4 illustrate that overlay inaccuracy depends on symmetric and asymmetric variations. Overlay errors are amplified by asymmetric process variations and shift in wavelength by symmetric process variations. Peaks of overlay inaccuracy are not fixed at specific wavelengths in the presence of symmetric process variations. As a result, the selection of a suitable illumination wavelength based on a particular inaccuracy landscape may prove inadequate in the presence of asymmetric and symmetric process variations. One may attempt to mitigate this risk by selecting the illumination wavelength in light of a number of inaccuracy landscapes that encompass a range of symmetric and asymmetric process variations, but in some examples, the variations may be so large that there is no illumination wavelength that will result in a sufficiently accurate overlay measurement. As a result, in some cases, it is impossible to generate an overlay measurement recipe based on the selection of illumination wavelength.

Additional description of inaccuracy landscapes is presented by Bringholz, Barak, et al. in "Accuracy in optical overlay metrology," Proc. of SPIE, Vol 9778, 9778H-1-19, published Mar. 24, 2016, the subject matter of which is incorporated herein by reference in its entirety.

Conventional SCOL and DBO techniques require four different targets (e.g., a metrology target having four different cells) to measure overlay in two directions (i.e., two cells associated with each different direction). This increases move-acquire-measure (MAM) times and target area on the wafer.

In addition, the overlay accuracy of conventional SCOL and DBO techniques is significantly affected by optical system variations and aberrations. This makes it difficult to achieve accurate overlay measurements and sufficiently accurate tool matching.

Future overlay metrology applications present challenges for metrology due to increasingly small resolution requirements and the increasingly high value of wafer area. Thus, methods and systems for improved overlay measurements are desired.

SUMMARY

Methods and systems for robust overlay error measurement based on a trained measurement model are described herein. The measurement model is trained from raw scatterometry data collected from Design of Experiments (DOE) wafers by a scatterometry based overlay metrology system. Each measurement site includes one or more metrology targets fabricated with programmed overlay variations and known process variations. Each measurement site is measured with known metrology system variations. In this manner, the measurement model is trained to separate actual overlay from process variations and metrology system variations which affect the overlay measurement. As a result, an estimate of actual overlay by the trained measurement model is robust to process variations and metrology system variations.

Errors and approximations associated with traditional model based metrology methods are reduced by using only raw scatterometry data to create the measurement model. In addition, the measurement model is not sensitive to systematic errors, asymmetries, etc., because the measurement model is trained based on scatterometry data collected from a particular metrology system and used to perform measurements based on scatterometry data collected from the same metrology system.

In one aspect, an optimized set of programmed overlay variations is fabricated as a function of location on one or more DOE wafers. In some examples, cross-wafer variations of one or more process parameters and cross-wafer variations of one or more structural parameters that induce variations in overlay measurement are also fabricated as a function of location on a DOE wafer.

In a further aspect, the DOE includes a range of different values of one or more system parameter values associated with the scatterometry measurement system(s) employed to measure the DOE metrology targets to generate training data.

In another aspect, the value of actual overlay associated with each fabricated metrology target is estimated based on a series of measurements of each fabricated metrology target with the scatterometry overlay measurement system, itself, employing a zero error overlay (ZEO) estimation method.

The ZEO method is employed to estimate overlay more accurately from SCOL overlay measurements performed at a few different illumination wavelengths.

In another aspect, each measurement site includes a single cell metrology target having an array of grating structures having periodicity in at least one direction. Hence, a scatterometry measurement of the single cell metrology target is sensitive to overlay in at least one direction. In some embodiments, the single cell metrology target includes an array of grating structures having periodicity in at least two directions. Hence, the measurement of the single cell target is sensitive to overlay in two directions. In general, the measured overlay structures may be located on the same layer or on different layers of the substrate.

In a further aspect, a single cell metrology target includes an array of grating structures having two or more different periodicities in at least one direction. For example, the gratings of a top layer and the gratings of an underlayer may be segmented with a smaller pitch grating or device like structures.

In another aspect, a trained measurement model is employed as the measurement model for measurement of other targets having unknown overlay values.

In a further aspect, the methods and systems described herein are not limited only to the measurement of overlay errors. In general, the scatterometry-based measurement techniques described herein may be applied to the measurement of other process, structure, dispersion parameters, or any combination of these parameters. By way of non-limiting example, profile geometry parameters (e.g., critical dimension), process parameters (e.g., focus, and dose), dispersion parameters, pitch walk, or any combination of parameters may be measured. A set of training targets with programmed variations for each parameter of interest must be provided. The measurement model is then trained based on scatterometry data collected over measurement sites that include the range of programmed variations of each parameter of interest.

In another further aspect, the methods and systems for training the measurement model include an optimization algorithm to automate any or all of the elements required to arrive at a trained measurement model.

In another further aspect, scatterometry data from multiple, different targets are collected for model building, training, and measurement. The use of measurement data associated with multiple targets having different structure, but formed by the same process conditions and programmed overlay values increases the information embedded in the model and reduces the overlay correlation to process or other parameter variations.

In another further aspect, measurement data derived from measurements performed at multiple values of one or more measurement system parameters are collected for model building, training, and measurement. By way of non-limiting example, measurements performed at multiple illumination wavelengths, polarizations, etc., are employed to train a measurement model and perform measurements using the trained measurement model as described herein.

In another further aspect, measurement data derived from measurements performed by a combination of multiple, different measurement techniques is collected for model building, training, and measurement. The use of measurement data associated with multiple, different measurement techniques increases the information content in the combined set of signals and reduces the overlay correlation to process or other parameters variations.

In another aspect, the measurement model results described herein can be used to provide active feedback to a process tool (e.g., lithography tool, etch tool, deposition tool, etc.). For example, values of overlay error determined using the methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for robust overlay error measurement based on a trained measurement model are described herein. The measurement model is trained from raw scatterometry data collected from Design of Experiments (DOE) wafers by a scatterometry based overlay metrology system. Each measurement site includes one or more metrology targets fabricated with programmed overlay variations and known process variations. Each measurement site is measured with known metrology system variations (i.e., measurement system parameter values) to which the scatterometry based overlay metrology system is sensitive. In this manner, the measurement model is trained to separate actual overlay from process variations and metrology system variations which affect the overlay measurement. Thus, an estimate of actual overlay by the trained measurement model is robust to process variations and metrology system variations. As a result, estimates of actual overlay are consistent and accurate across a range of illumination wavelengths without target design optimization.

By using only raw scatterometry data to create the measurement model, as described herein, the errors and approximations associated with traditional model based metrology methods are reduced. In addition, the measurement model is not sensitive to systematic errors, asymmetries, etc., because the measurement model is trained based on scatterometry data collected from a particular metrology system and used to perform measurements based on scatterometry data collected from the same metrology system.

Figure 1A:
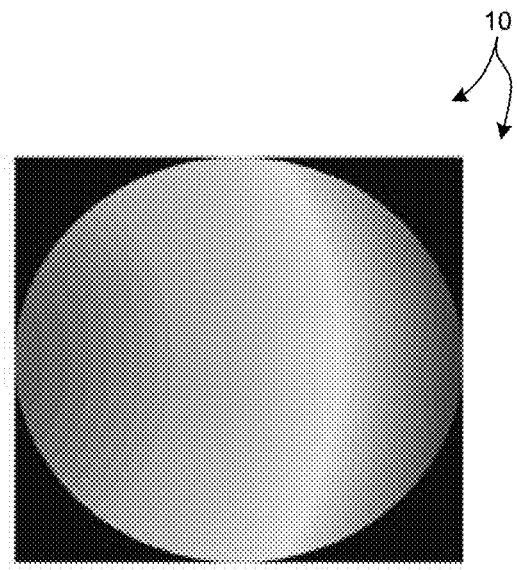
FIGS. 1A-1C illustrate pupil images of one measured diffraction order associated with a SCOL measurement performed at three different illumination wavelengths.
Figure 1B:
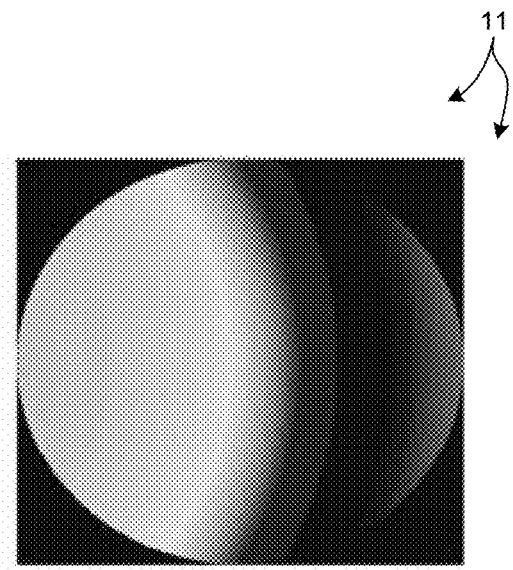
Figure 1C:
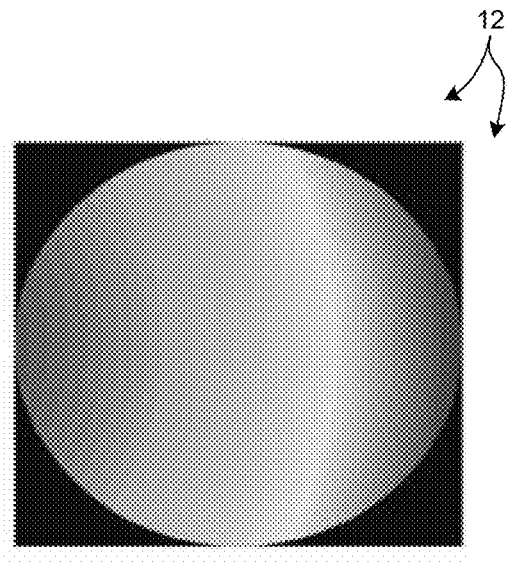
Figure 2:
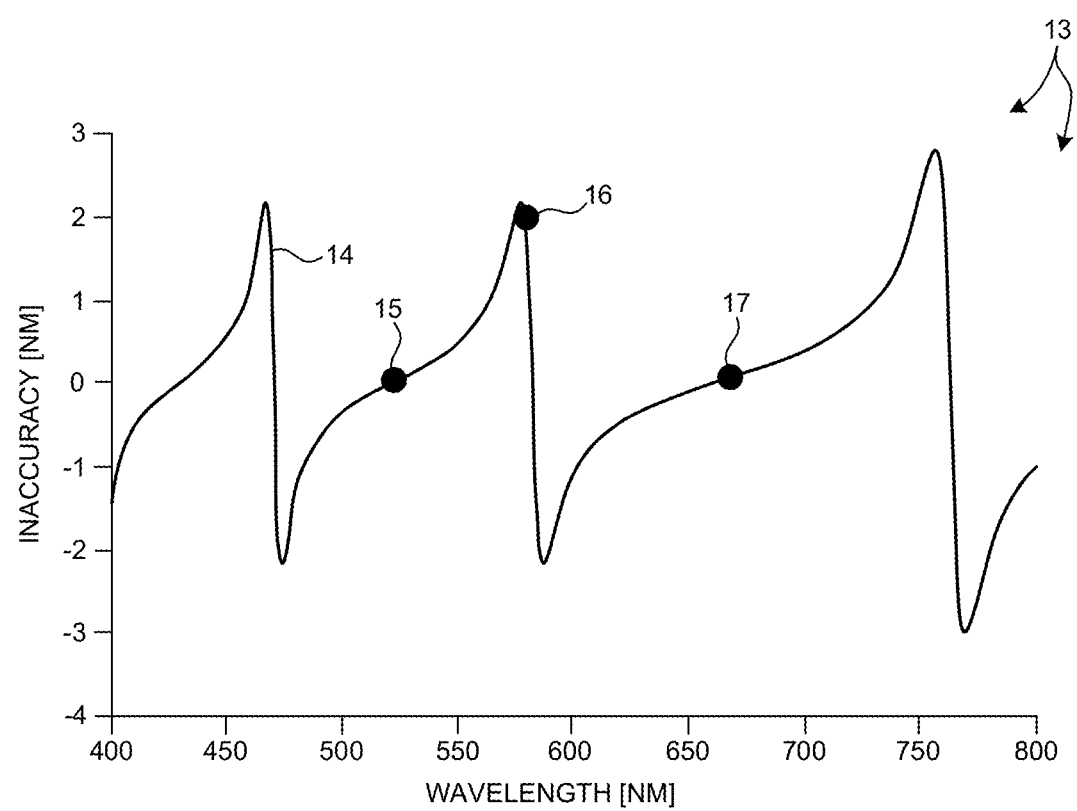
FIG. 2 depicts a plot of inaccuracy of overlay measurement by a SCOL system over a range of wavelengths.
Figure 3:
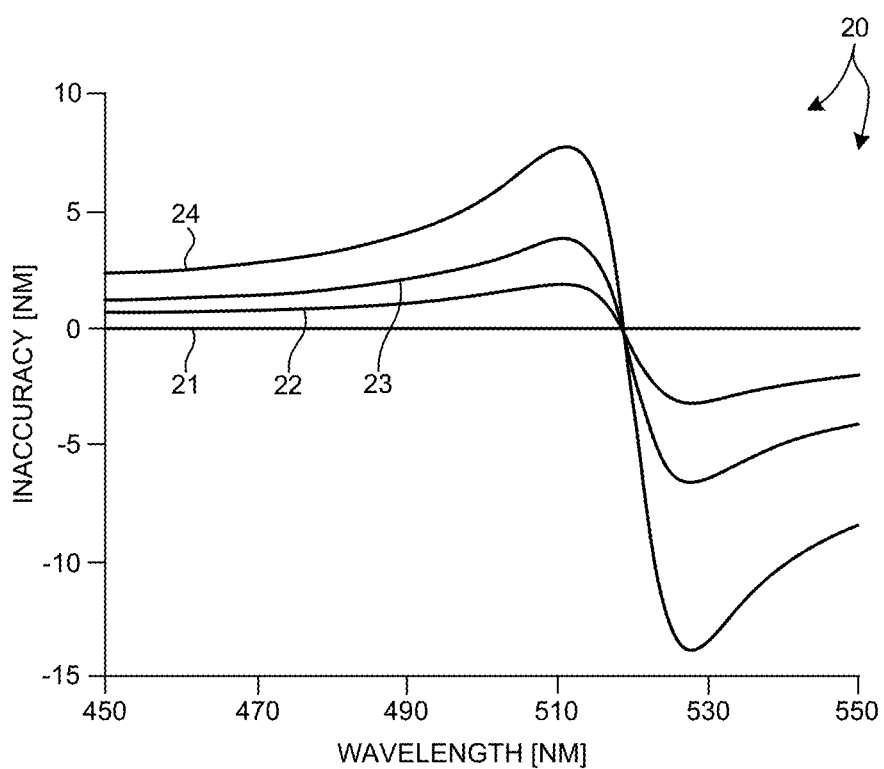
FIG. 3 depicts a plot of several inaccuracy landscapes, each associated with a different value of line profile asymmetry.
Figure 4:
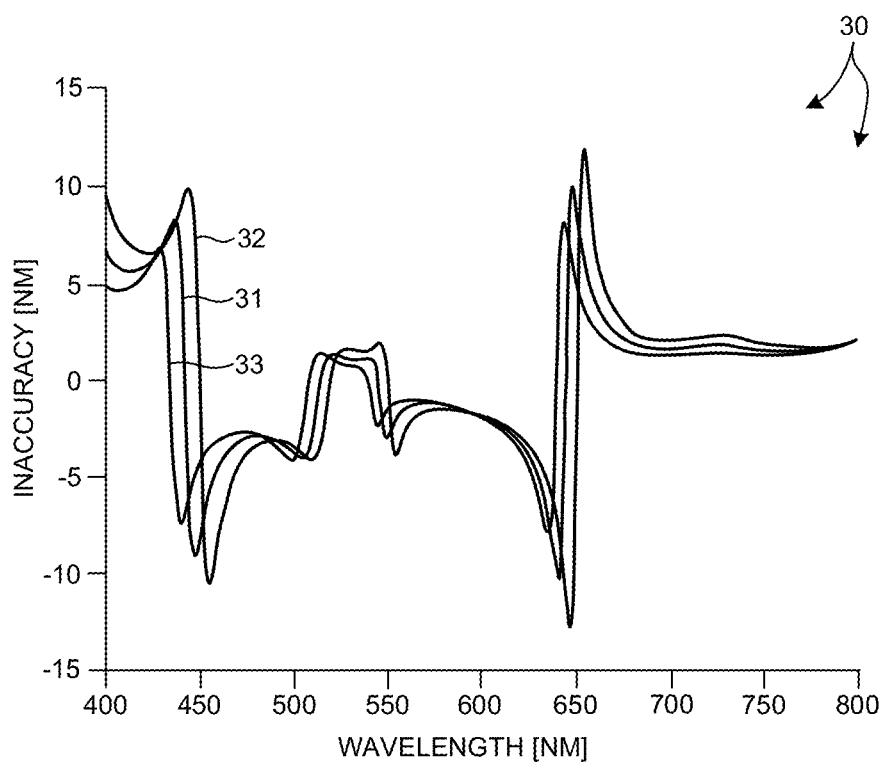
FIG. 4 depicts a plot of several inaccuracy landscapes, each associated with a different value of a symmetrical process variation.
Figure 5:
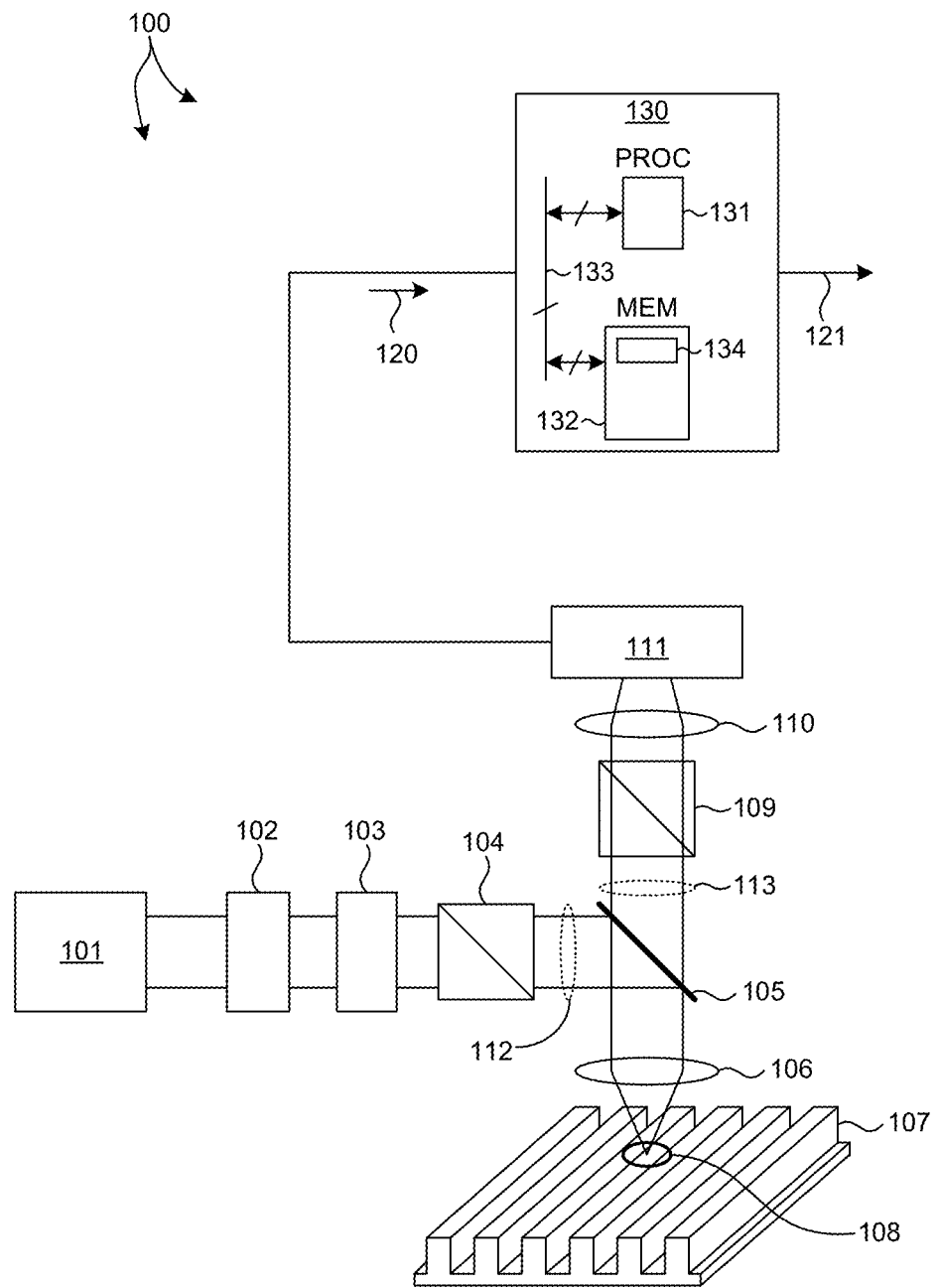
FIG. 5 illustrates a system 100 for measuring overlay error in accordance with the exemplary methods presented herein.

FIG. 5 illustrates a system 100 for measuring overlay error in accordance with the exemplary methods presented herein. As shown in FIG. 5, the system 100 may be used to perform scatterometry overlay (SCOL) measurements of one or more structures of a specimen 107. In this aspect, the system 100 may include a scatterometer equipped with an illuminator 101 and an imaging detector 111. The illuminator 101 of system 100 is configured to generate and direct illumination of a selected wavelength or wavelength range (e.g., 100-2500 nm) to the structure disposed on the surface of the specimen 107. In turn, the imaging detector 111 is configured to receive illumination scattered from the surface of the specimen 107. In some embodiments, illuminator 101 includes at least one laser. In some of these embodiments, the laser is capable of selecting the illumination wavelength based on a command signal received from computing system 130.

In the embodiment depicted in FIG. 5, system 100 includes a wavelength selection device 102, beam shaping device 103, and polarization control device 104 in the illumination path. Wavelength selection device 102 includes one or more optical elements (e.g., optical filters, etc.) configured to selectively pass a desired illumination wavelength or range of wavelengths and reject other illumination wavelengths. In some embodiments, wavelength selection device 102 is controlled by computing system 130. In these embodiments, computing system 130 is configured to communicate control commands indicative of a desired wavelength or range of wavelengths to wavelength selection device 102. In response, wavelength selection device 102 selectively passes the desired wavelengths or ranges of wavelengths. Beam shaping device 103 includes one or more optical elements configured to shape the illumination beam provided to the surface of specimen 107. In some embodiments, beam shaping device 103 is controlled by computing system 130. In these embodiments, computing system 130 is configured to communicate control commands indicative of a desired beam shape to beam shaping device 103. In response, beam shaping device 103 selectively reshapes the illumination beam to achieve the desired illumination beams shape provided to the surface of specimen 107. In some embodiments, illumination light emerging from the illuminator 101 is polarized by polarization control device 104 to produce a polarized illumination beam provided to specimen 107. In some embodiments, polarization control device 104 is controlled by computing system 130. In these embodiments, computing system 130 is configured to communicate control commands indicative of a desired polarization to polarization control device 104. In response, polarization control device 104 selectively polarizes the illumination light to achieve the desired polarization state. The illumination beam 112 is directed to beam splitter element 105, which directs illumination beam 112 toward objective 106, and onto the surface of specimen 107. Radiation scattered by the metrology target 108 under measurement disposed on the specimen 107 is collected by objective 106 and passed through beam splitter element 105. In some embodiments, collected light 113 is analyzed by polarization analyzer device 109 to produce an analyzed collection beam provided to imaging detector 111. In some embodiments, polarization analyzer device 109 is controlled by computing system 130. The collected light 113 is directed to focusing optics 110, which image the collected light 113 onto imaging detector 111. Imaging detector 111 is located in a pupil plane conjugate to the surface of specimen 107. The measured pupil images 120 are communicated to computing system 130 for analysis of the metrology target under measurement.

In a further embodiment, system 100 may include one or more computing systems 130 employed to perform overlay measurements based on trained measurement models developed in accordance with the methods described herein. The one or more computing systems 130 may be communicatively coupled to the imaging detector 111. In one aspect, the one or more computing systems 130 are configured to receive measurement data 120 associated with measurements of metrology targets disposed on specimen 107.

It should be recognized that the various steps described throughout the present disclosure may be carried out by a single computer system 130 or, alternatively, a multiple computer system 130. Moreover, different subsystems of the system 100, such as the imaging detector 111, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the imaging detector 111 in any manner known in the art. For example, the one or more computing systems 130 may be coupled to computing systems associated with the imaging detector 111. In another example, the imaging detector 111 may be controlled directly by a single computer system coupled to computer system 130.

The computer system 130 of the overlay metrology system 100 may be configured to receive and/or acquire data or information from the subsystems of the system (e.g., imaging detector 111 and the like) by a transmission medium that may include wireline and/or wireless portions. In this manner, the transmission medium may serve as a data link between the computer system 130 and other subsystems of the system 100.

Computer system 130 of the overlay metrology system 100 may be configured to receive and/or acquire data or information (e.g., measurement results, modeling inputs, modeling results, etc.) from other systems by a transmission medium that may include wireline and/or wireless portions.

In this manner, the transmission medium may serve as a data link between the computer system 130 and other systems (e.g., memory on-board metrology system 100, external memory, a reference measurement source, or other external systems). For example, the computing system 130 may be configured to receive measurement data from a storage medium (i.e., memory 132 or an external memory) via a data link. For instance, measurement results obtained using imaging detector 111 may be stored in a permanent or semi-permanent memory device (e.g., memory 132 or an external memory). In this regard, the measurement results may be imported from on-board memory or from an external memory system. Moreover, the computer system 130 may send data to other systems via a transmission medium. For instance, a measurement model or an overlay parameter 121 determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 5, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

Figure 6:
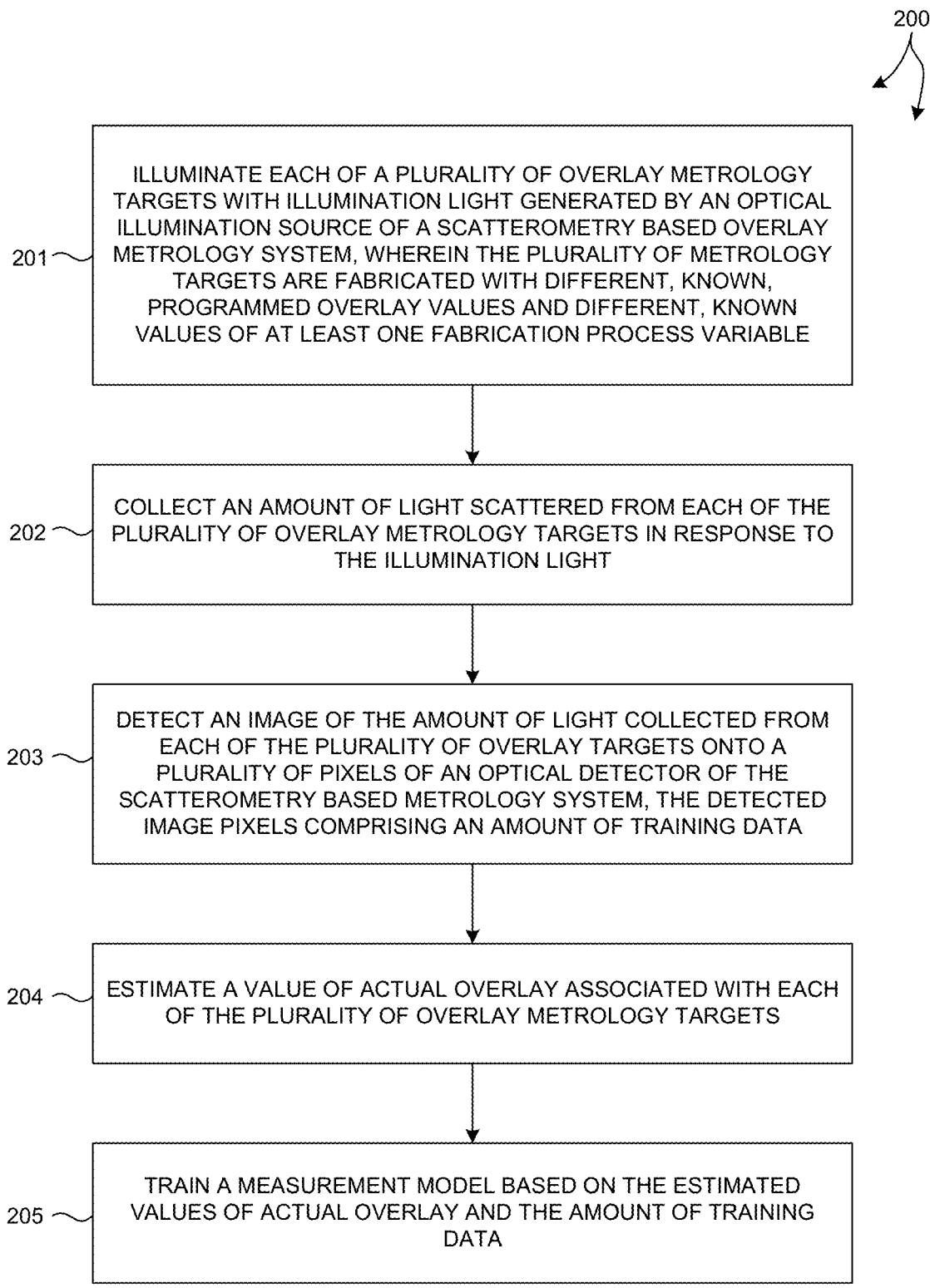
FIG. 6 illustrates a method suitable for implementation by a metrology system such as metrology system 100 illustrated in FIG. 5 of the present invention.

FIG. 6 illustrates a method 200 suitable for implementation by a metrology system such as metrology system 100 illustrated in FIG. 5 of the present invention. In one aspect, it is recognized that data processing blocks of method 200 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 201, each of a plurality of overlay metrology targets are illuminated with illumination light generated by an optical illumination source (e.g., illuminator 101) of a scatterometry based overlay metrology system. The plurality of metrology targets are fabricated with different, known, programmed overlay values and different, known values of at least one fabrication process variable.

In general, the metrology targets used for training are fabricated on one or more Design Of Experiments (DOE) wafers. Each DOE wafer is exposed with known, programmed overlay. The programmed overlay may have different values within a field of a DOE wafer, between different fields of a DOE wafer, or between different DOE wafers. Typically, the range of programmed overlay variations designed to be the same or greater than the expected variation in overlay (i.e., overlay process window).

In some embodiments, variations of overlay are organized in a Design of Experiments (DOE) pattern on the surface of a semiconductor wafer (e.g., DOE wafer). In this manner, the measurement sites interrogate different locations on the wafer surface that correspond with different overlay values.

In some embodiments, the programmed overlay variations are designed to minimize correlation with any of the expected process variations and structural parameter variations. In addition, the programmed overlay variations are designed to minimize correlation with variations in other overlay structures (e.g., overlay in other directions, overlay of deeper layers, etc.).

In one aspect, an optimized set of programmed overlay variations and their locations on one or more DOE wafers is determined, for example, by computing system 130. In one example, computing system 130 is configured to define a set of programmed overlay values that spans the expected range of overlay variation. For example, a set of programmed overlay values may include a range of programmed overlay values in the x-direction from −10 nanometer to 10 nanometers with a resolution of one nanometer (i.e., ProgrammedOverlayX={−10 nm, −9 nm, . . . , 0 nm . . . , 9 nm, 10 nm} and in the y-direction from −10 nanometer to 10 nanometers with a resolution of one nanometer (i.e., ProgrammedOverlayY={−10 nm, −9 nm, . . . , 0 nm . . . , 9 nm, 10 nm}.

In this example, computing system 130 is further configured to determine cross-wafer variations of one or more process parameters and cross-wafer variations of one or more structural parameters that induce variations in overlay measurement. In this manner, the process variations and structural parameter variations are determined as a function of location on a DOE wafer (e.g., {x,y} coordinates).

Computing system 130 is further configured to assign locations to each of the programmed overlay values (e.g., map values of {ProgrammedOverlayX, ProgrammedOverlayY} to different {x,y} wafer coordinates. The assignment of locations is optimized such that the correlation between programmed overlay and process variations is minimized.

Computing system 130 is further configured to communicate the programmed overlay values and their assigned wafer coordinates to a lithography tool as an overlay DOE (i.e., scanner recipe). The lithography tool then prints the programmed overlay values onto the DOE wafer(s) at the desired locations.

In general, the DOE wafer set is fabricated with known values of at least one fabrication process variable. In some embodiments, one or more layers of a wafer that comprise a metrology target are fabricated with programmed values of lithography focus and dosage. However, the robustness of the trained measurement model is increased by fabricating the DOE wafer set with known values of a larger number of fabrication process variables. Ideally, the DOE wafer set is fabricated with known values spanning the process windows of all processes and structural parameters. However, practical limits on fabrication time and measurement time impose limits on the number of process and structural variables to be considered within the DOE set.

In one example, the DOE wafer set includes a large range of programmed values of critical dimension (CD) of a bottom grating structure. The bottom grating structure is repeatedly fabricated with different lithography dosage values at the lithography step employed to form the bottom grating pattern.

In another example, the DOE wafer set includes a range of programmed values of focus, dosage, overlay in the x-direction, and overlay in the y-direction for a grating overlay structure, and a range of programmed values of focus and dosage for a previous grating layer.

In another example, the DOE wafer set includes a range of process parameter values at each process step (e.g., deposition, etch, chemical mechanical polishing, etc.).

In a further aspect, the DOE includes a range of different values of one or more system parameter values associated with the scatterometry measurement system, or systems, employed to measure the DOE metrology targets to generate training data. As a result, trained measurement model is robust to measurement system variations (e.g., optical system variations). In one example, optical scatterometry signals associated with the measurement of each metrology target includes signals collected at multiple, different system conditions. For example, the collected optical signals could include signals from multiple wavelengths and multiple polarizations.

In block 202, an amount of light scattered from each of the plurality of overlay metrology targets in response to the illumination light is collected, for example, by the collection optics of scatterometry overlay measurement system 100 depicted in FIG. 5.

In block 203, an image of the amount of light collected from each of the plurality of overlay targets is detected by a plurality of pixels of an optical detector of the scatterometry based metrology system. The detected optical signals associated with measurements of each of the metrology targets of the DOE wafer set measured at each different measurement system configuration comprises an amount of training data.

In the embodiment depicted in FIG. 5, the optically sensitive area of imaging detector 111 is located at or near a pupil image plane of the scatterometry based metrology system 100. Thus, system 100 collect pupil images of light diffracted from each measured metrology target. In some embodiments, system 100 collects pupil images of light diffracted at the +1/−1 diffraction orders from each measured metrology target.

In block 204, a value of actual overlay associated with each of the plurality of overlay metrology targets is estimated.

In some examples, the value of actual overlay associated with each metrology target is estimated to be the known, programmed overlay value associated with each metrology target.

In some other examples, the value of actual overlay associated with each metrology target is estimated by measurement of each metrology target with a trusted, reference metrology system. For example, any of a critical dimension, scanning electron microscope (CD-SEM), X-ray enhanced SEM, optical critical dimension tool, transmission electron microscope (TEM), and a small angle X-ray scatterometry (SAXS) tool may be employed as a reference metrology system. In one example, the value of actual overlay is estimated by performing SCOL or IBO measurements at multiple azimuth angles and subtracting the tool induced shift (TIS) errors.

In another aspect, the value of actual overlay associated with each fabricated metrology target is estimated based on a series of measurements of each fabricated metrology target with the scatterometry overlay measurement system, itself, employing a zero error overlay (ZEO) estimation method as described herein.

The ZEO method is employed to estimate overlay more accurately from SCOL overlay measurements performed at a few different illumination wavelengths. The objective is to obtain the zero error overlay location with reference to a peak in the SCOL overlay measurement curve (i.e., a particular distance from a peak value). Distances of the zero error overlay location from a peak value of a SCOL overlay curve remain very similar despite significant changes in process and structural parameter values. As described hereinbefore, a SCOL overlay curve typically scales, shifts, or both, depending on process and structural parameter values. Thus, the shape of a SCOL overlay estimation curve over wavelength is roughly preserved despite changes in process and structural parameter values, and the distance of the zero error overlay location to the peak remains nearly constant. In particular, asymmetric variations cause scaling of the shape, symmetric variations (e.g., process variations) cause a shift of the shape in wavelength direction (i.e., horizontal direction), and changes in programmed overlay cause a shift of the direction of estimated overlay (i.e., vertical axis). However, in spite of these variations, the distance of the zero error overlay location to the peak remains nearly constant.

Figure 10:
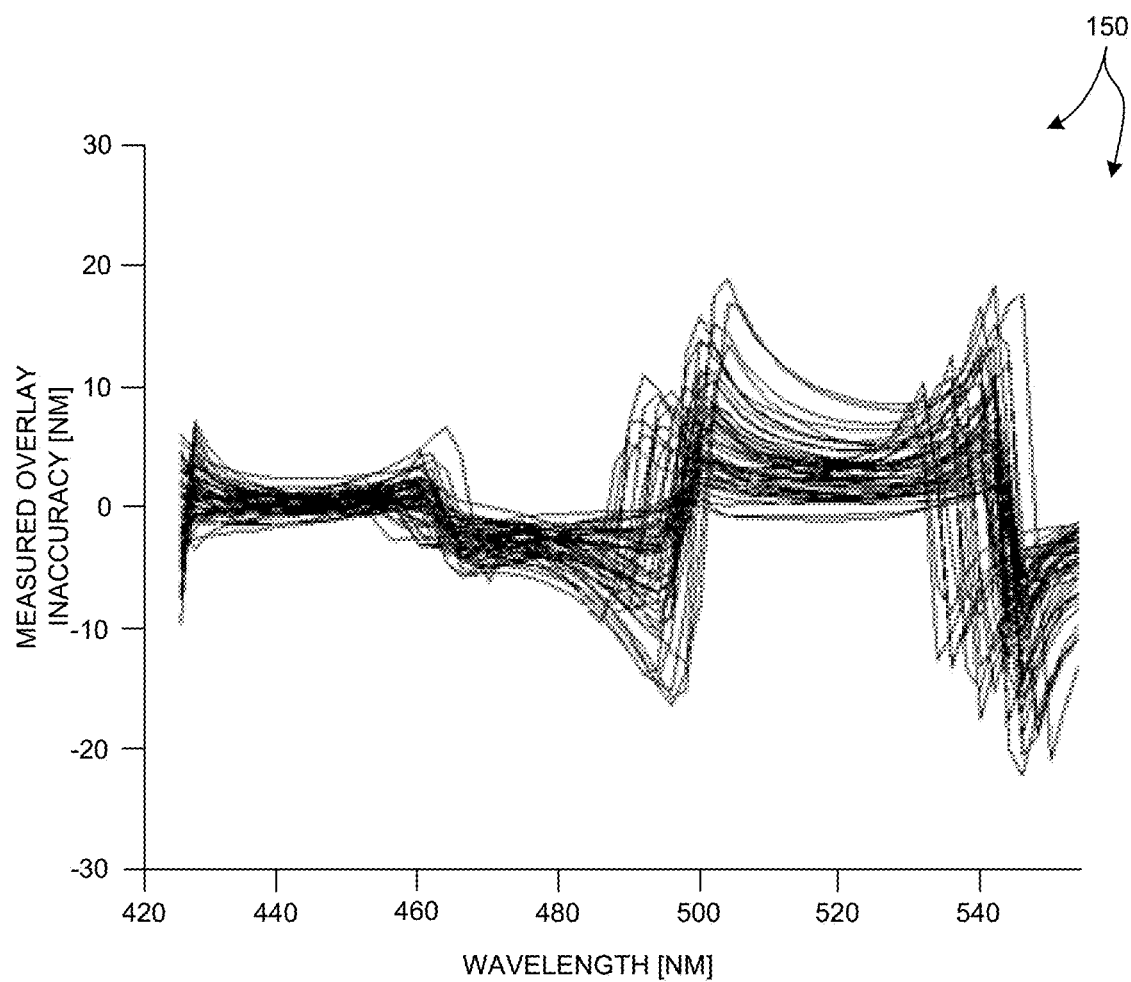
FIG. 10 depicts a plot including a number of overlay error measurements as a function of wavelength.

FIG. 10 depicts a plot 150 including a number of overlay error measurements as a function of wavelength. Each plotline represents a measurement of a metrology target fabricated with different values of one or more process variables and asymmetric structural variables. As illustrated in FIG. 10, the shape of the SCOL overlay estimation curves remain intact, although the curves are scaled and shifted with respect to one another.

In one example, the scatterometry overlay measurement system is employed to measure the optical response of each metrology target at a number of different illumination wavelengths. In this sense, the scatterometry overlay measurement system illuminates each of the overlay metrology targets at a number of different illumination wavelengths, collects an amount of light scattered from each of the plurality of overlay metrology targets in response to each different illumination wavelength at the +1/−1 diffraction orders, and detects an image of the amount of light collected from each overlay metrology target at each different illumination wavelength.

A computing system (e.g., computing system 130) estimates a candidate value of actual overlay based on differences between the +1 and −1 diffraction orders for each different illumination wavelength.

In some embodiments, the candidate values are interpolated over wavelength to realize a finer wavelength interval. This provides a smooth curve, more accurate peak values, and enables a more accurate estimation of zero error overlay location. In some examples, linear, polynomial or spline interpolation methods are employed to achieve a high degree of smoothness and elasticity. In one example, cubic spline interpolation is employed.

In some embodiments, the overlay estimate as a function of wavelength is employed for ZEO analysis. However, in some other embodiments, an R value as a function of wavelength is employed for ZEO analysis. In some embodiments, the R-curve is advantageous as it is generally smoother. The R-curve is computed using equation (1), where the bracket notation (< >) signifies inner product over pixels in the mask, $I_o$, denotes the apodizer function in the charge coupled device (CCD) camera employed as the imaging detector, and, G, is the SCOL difference signal representative of measured asymmetry.

$$R = \sqrt{1 - \frac{\langle I_O G \rangle^2}{\langle I_O \rangle^2 \langle I_O G \rangle^2}} \qquad (1)$$

Figure 11:
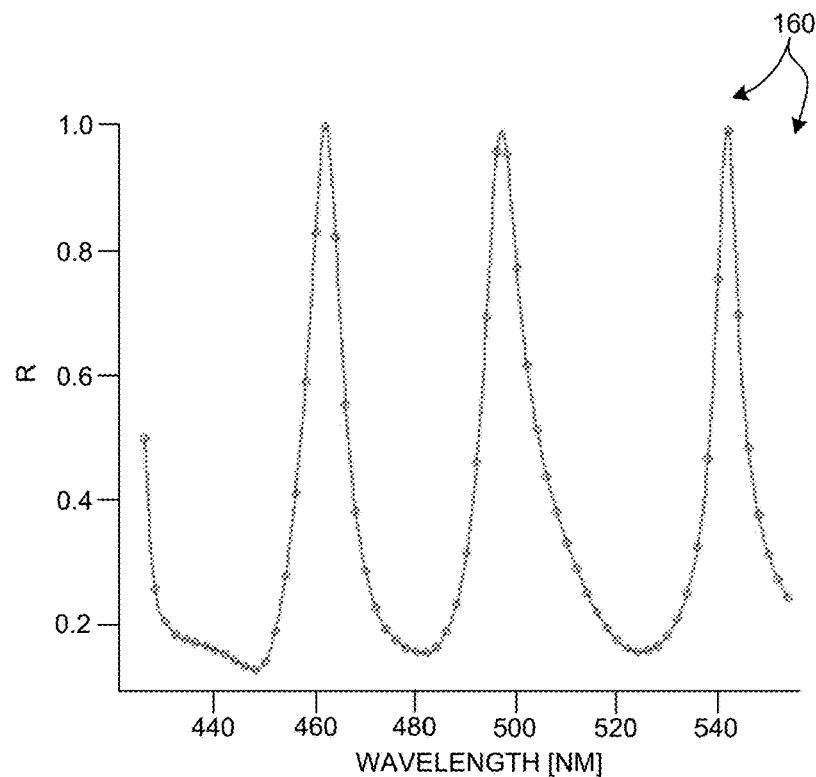
FIG. 11 illustrates a plot including an interpolated R-curve as a function of wavelength.
Figure 12:
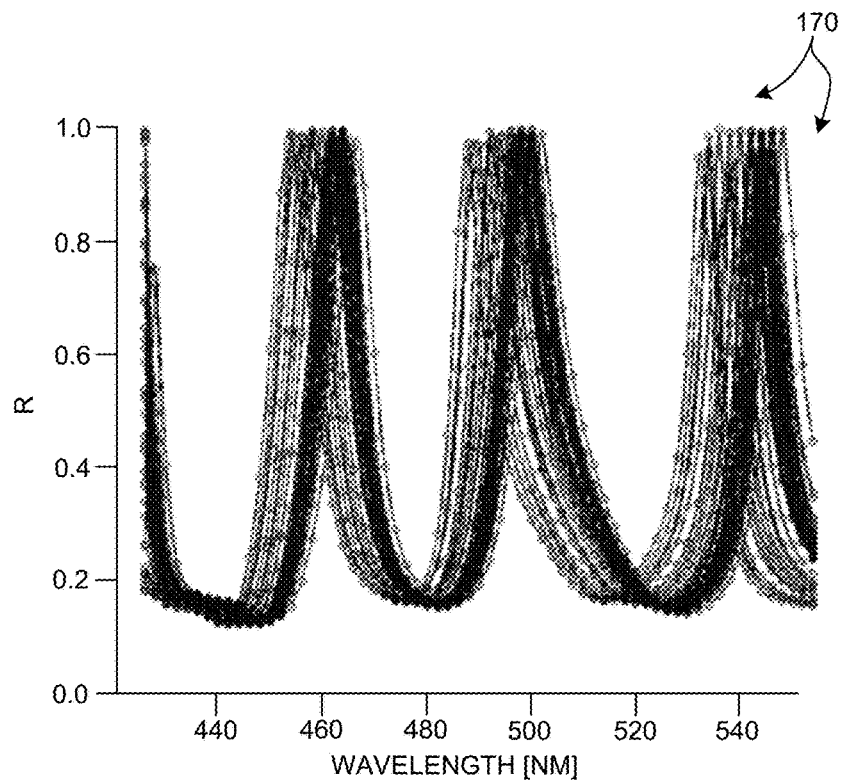
FIG. 12 illustrates a plot including a number of R-curves as a function of wavelength.

FIG. 11 illustrates a plot 160 including an interpolated R-curve as a function of wavelength. Similarly, FIG. 12 illustrates a plot 170 including a number of R-curves as a function of wavelength. Each plotline represents a measurement of a metrology target fabricated with different values of one or more process variables. As illustrated in FIG. 12, the shape of the R-curves remain intact, although the curves are shifted with respect to one another.

The computing system is further configured to determine a peak value of actual overlay from the candidate values. Among the entire range of illumination wavelengths, there may be multiple ZEO points, however, not all of them are easily detected. Peaks in the overlay estimation curves, or R-curves, are easier to detect. Once a peak is detected, a search for a ZEO location is conducted within a region of interest around the selected peak.

Figure 13:
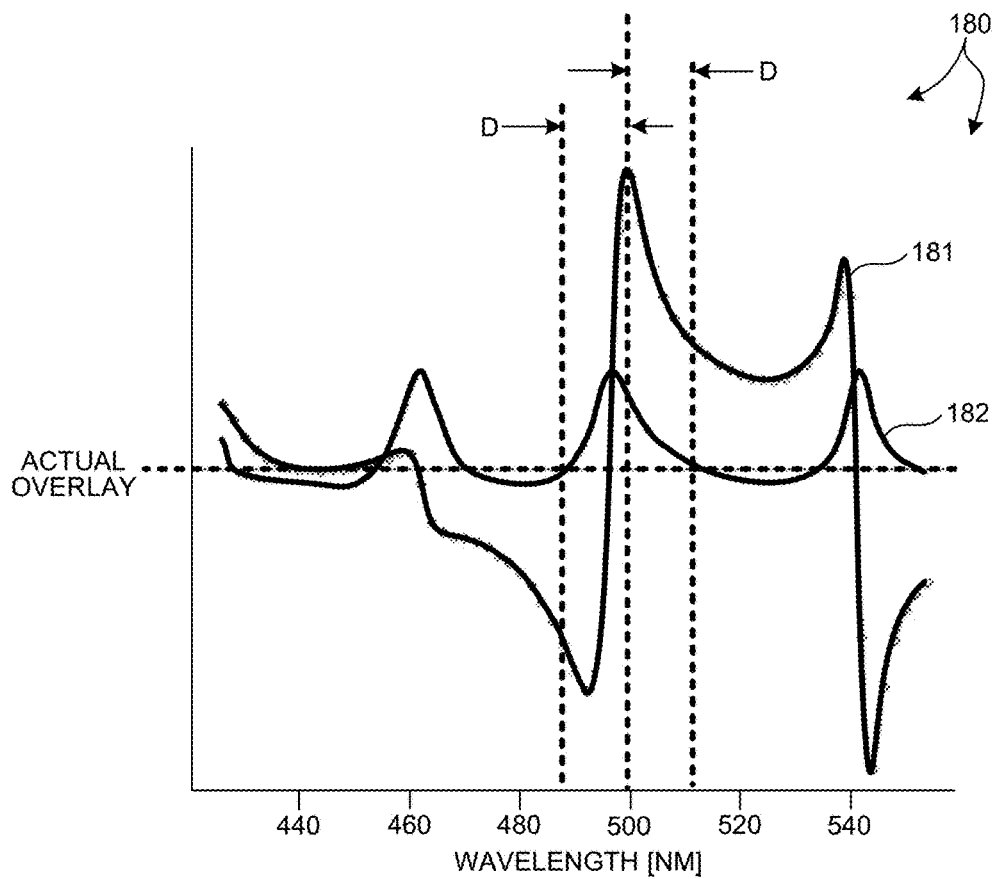
FIG. 13 depicts a plot illustrative of an overlay estimation curve and an R-curve associated with a series of measurements performed by a SCOL metrology system at different wavelengths.

FIG. 13 depicts a plot 180 illustrative of an overlay estimation curve 182 and an R-curve 181 associated with a series of measurements performed by a SCOL metrology system at different wavelengths. As illustrated in FIG. 13, typically, two or three peaks are present in an overlay estimation curve, or R-curve, and each peak lies within a specific wavelength range. In some examples, the illumination wavelength range is subdivided into several non-overlapping intervals, each interval associated with only one peak. The maximum point of the curve is identified within each interval, along with the associated illumination wavelength. As depicted in FIG. 13, the overlay estimation curve 182 is almost symmetric near the middle peak of the R-curve. As illustrated in FIG. 13, overlay estimation curve 182 intersects the actual overlay value at nearly the same distance, D, from the peak location the middle peak of the R-curve.

The computing system is further configured to determine a difference in wavelength from the wavelength associated with the peak value that minimizes within-wafer overlay variation. In the example illustrated in FIG. 13, the computing system identifies the distance, D, between the peak value of R-curve 181, and the SCOL overlay estimate associated with ZEO.

The SCOL overlay estimate, $S_i$, for a particular measurement site measured at a particular wavelength is described by equation (2), where $$S_i = O_0 + w_i + e_i \tag{2}$$

$O_0$, is the programmed overlay value associated with the measurement site, $w_i$, is the within-wafer variation, and is the SCOL measurement error. The within-wafer variation can be estimated as a Gaussian distribution having zero mean and a variance, $\sigma_w^2$, i.e., $w_i \sim N(0, \sigma_w^2)$. Similarly, SCOL measurement error can be estimated as a Gaussian distribution having zero mean and a variance, $\sigma_e^2$, i.e., $e_i \sim N(0, \sigma_e^2)$. In addition, it is assumed that the within-wafer variation is uncorrelated with SCOL measurement error. In one example, the ZEO location where the error is smallest is determined by minimizing the mean squared error of the SCOL measurement error as described by equation (3), where $$MSE = E[e^2] = E[(S-O_0-w)^2] = E[S^2] + O_0^2 - 2O_0 \cdot E[S] + \sigma_w^2 \tag{3}$$

E[ ] denoted the expectation. When $O_0$ is not available, the ZEO location where the error is smallest is determined by minimizing the mean squared error of the SCOL measurement error as described by equation (4), $$MSE = Var[e^2] = E[(S-O_0-w)_2] - [E[(S-(O_0+w))]]^2 = Var[S^2] + \sigma_w^2 \tag{4}$$

Since $\sigma_w^2$ is unknown and constant, the minimization of equation (4) simplifies to the minimization of Var[$S^2$]. As such, the computer system is configured to find the optimal illumination wavelength (i.e., a distance, D, from the illumination wavelength associated with the peak), where within-wafer variation of the SCOL overlay measurement is minimized. Since the slope around the identified peak is very steep, this may result in large errors. To mitigate this risk, the within-wafer variance is evaluated at two locations symmetric to the peak (i.e., a distance, +/-d, from the peak), and averaged, as illustrated by equation (5), where $$f(d) = \text{var}\left(\frac{S(\text{peak}-d) + S(\text{peak}+d)}{2}\right) \tag{5}$$

f(d) is the variation of the average of symmetric locations located at a distance, d, from the peak. The solution of equation (5) is illustrated by equation (6), where $$d^* = \underset{d}{\text{argminvar}}\left(\frac{S(\text{peak}-d) + S(\text{peak}+d)}{2}\right) \tag{6}$$

d* is the estimated value for d where Var($S^2$) is minimized. the ZEO estimate, O*, is described by equation (7).

$$O^* = \left(\frac{S(\text{peak}-d^*) + S(\text{peak}+d^*)}{2}\right) \tag{7}$$

Figure 14:
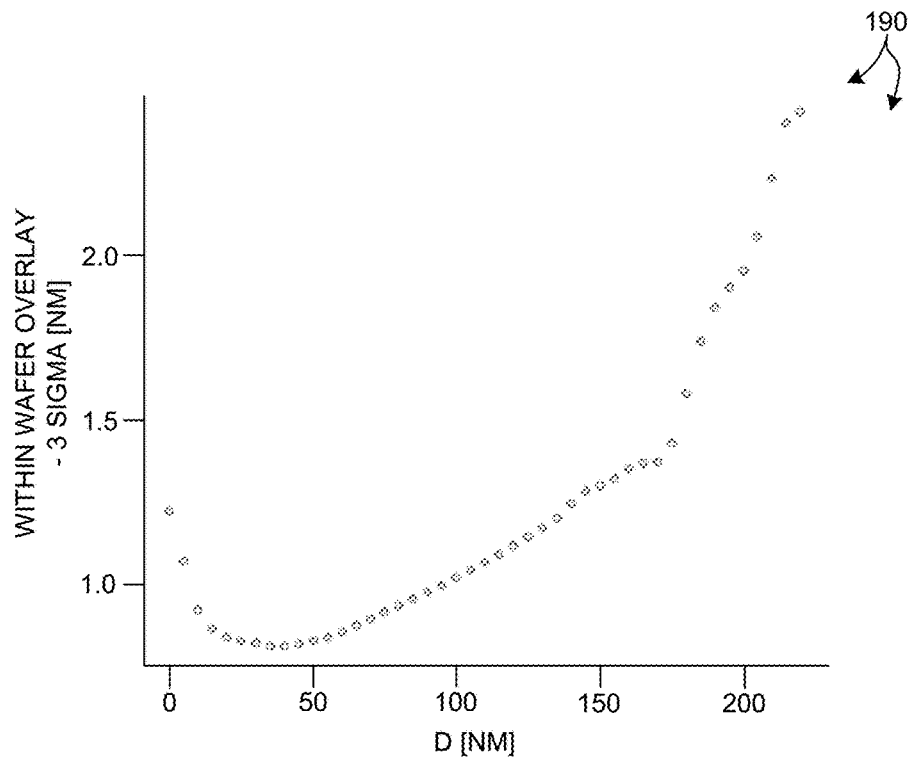
FIG. 14 illustrates a plot of a set of points each associated with the within-wafer variation of the measured overlay evaluated at a different distance from a peak location.

In some examples, the computing system is configured to calculate the within-wafer variation over a discrete set of distances from the peak, select the distance where the within-wafer variation is smallest, and determine the average SCOL measurements at the wavelength locations that are +/-the optimal distance from the peak as the ZEO value. FIG. 14 illustrates a plot 190 of a set of points each associated with the within-wafer variation of the measured overlay evaluated in accordance with equation (6) at a different distance, d, from a peak location. As depicted in FIG. 14, the minimum variance is located at a distance of approximately 30 nanometers from the peak location. In this example, the ZEO value is estimated in accordance with equation (7) at a distance, d*, of approximately 30 nanometers.

Although equations (5-7) evaluate the ZEO value based on an average of two points symmetrically located about a peak location, in some other examples, the ZEO value may be determined based on two points located at different distances from the peak location (e.g., $-d_1$ and $+d_2$). More generally, a range of SCOL measurements within a distance range, r, from the peak may be used to find the ZEO value. In this example, an overlay estimate is described by equations (8) and (9), where $c_i$ are weighting coefficients, $$O = \sum_{i=1}^{k} c_i S(d_i) \tag{8}$$

where $$\text{peak}-r \leq d_i \leq \text{peak}+r \tag{9}$$

In this scenario the optimization problem may be expressed by equation (10), where values for $c_i$ are resolved to minimize the variance of sum of the weighted values of S ($d_i$). The ZEO value may be expressed by equation (11).

$$c^*_{1,...k} = \underset{c_{1,...k}}{\text{argminvar}} \left( \sum_{i=1}^{k} c_i S(d_i) \right) \quad (10)$$

$$O^* = \sum_{i=1}^{k} c^*_i S(d_i) \quad (11)$$

In some examples, the SCOL landscape is more flat around the peak location. In these examples, it may be sufficient to search in a single direction from the peak to find the ZEO location. In addition, if the SCOL landscape associated with each region of interest exhibits a very similar pattern, it may be suitable to compute the ZEO value associated with each peak, and then average the results to obtain a final estimate of the ZEO value.

In block 205, a measurement model is trained based on the estimated values of actual overlay and the amount of training data. The measurement model is structured to receive measurement data generated by a metrology system at one or more measurement sites, and directly determine the overlay associated with each measurement target.

In this sense, the trained measurement model establishes a functional relationship between the optical scatterometry signals and overlay values. In some embodiments, the relationship is described by a complex function, where the function coefficients are estimated based on the training signals (i.e., the collected optical scatterometry signals) and the estimated values of actual overlay.

In some examples, the measurement model is trained based on principal features extracted from the scatterometry training data and the estimated values of actual overlay. In these examples, a plurality of principal features of the amount of training data are determined based on a transformation of the amount of training data that reduces a dimension of the training data. A number of principal features are extracted from the scatterometry training data based on a mathematical transformation. The transformation reduces the dimension of the scatterometry data and maps the original signals to a new reduced set of signals. The transformation is determined based on the variations in overlay in the scatterometry training data. Each measured signal is treated as an original signal that changes within the process range for different overlay measurements in the set of scatterometry training data. The transformation may be applied to all of measurement signals, or a subset of measurement signals. In some examples, the signals subject to analysis are chosen randomly. In some other examples, the signals subject to analysis are chosen due to their relatively high sensitivity to changes in overlay. For example, signals that are not sensitive to changes in overlay may be ignored. By way of non-limiting example, the transformation may be achieved using any of a principal component analysis (PCA) model, a kernel PCA model, a non-linear PCA model, an independent component analysis (ICA) model or other dimensionality reduction methods using dictionaries, a discrete cosine transform (DCT) model, fast fourier transform (FFT) model, a wavelet model, etc.

In some embodiments, the measurement model is implemented as a neural network model. In one example, the number of nodes of the neural network is selected based on a number of features extracted from the training data. In other examples, the measurement model may be implemented as a linear model, a polynomial model, a response surface model, a support vector machines model, a decision tree model, a random forest model, or other types of models.

In some examples, the measurement model may be implemented as a combination of models. In some examples, the selected model is trained based on the principal features (reduced set of signals) and the known variations in overlay. The model is trained such that its output fits the defined variations in overlay for all the measured signals in the overlay variation space defined by the set of DOE metrology targets.

A variety of different metrology targets may be contemplated within the scope of this invention. In some embodiments, the metrology targets are based on conventional line/space targets. In some other embodiments, the metrology targets are device-like structures. In some other embodiments, the metrology targets are the actual devices themselves, thus no specialized metrology target is employed. Regardless of the type of metrology target employed, a set of training targets having known, programmed offsets must be provided to train the measurement model. Once the model is trained, it may be used to perform measurements of structures having unknown overlay.

The training targets may be provided on a separate training wafer or on a production wafer. In some examples, the metrology targets are located in a scribeline of a production wafer. In some other examples, the metrology targets are located in the active die area.

In some embodiments, the measurements used for model training are performed in a scribeline area and subsequent measurements are performed in a periodic area of the actual device.

In some embodiments, multiple, different targets offset in orthogonal directions are employed in each die. This may be advantageous to minimize the effects of underlayers on measurement accuracy.

In one aspect, each measurement site includes a single cell metrology target having an array of grating structures having periodicity in at least one direction. Hence, a scatterometry measurement of the single cell metrology target is sensitive to overlay in at least one direction. In some embodiments, the single cell metrology target includes an array of grating structures having periodicity in at least two directions. Hence, the measurement of the single cell target is sensitive to overlay in two directions. In general, the measured overlay structures may be located on the same layer or on different layers of the substrate.

Figure 8:
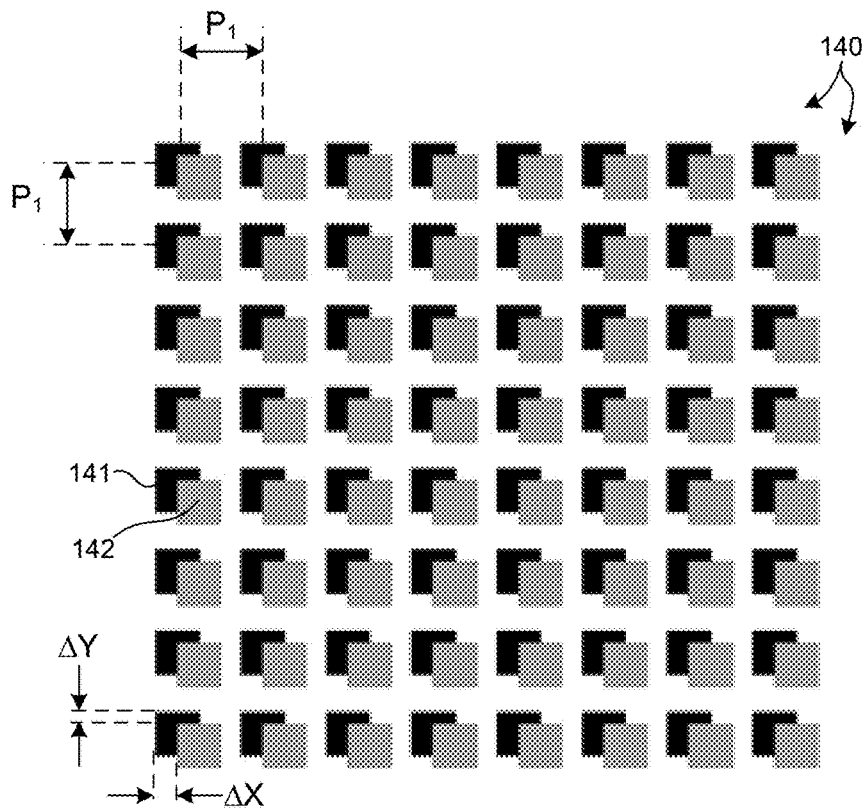
FIG. 8 depicts an illustration of a single cell overlay metrology target in one embodiment.

FIG. 8 depicts an illustration of a single cell overlay metrology target 140 in one embodiment. Metrology target 140 includes a grating of the top layer 142 and a grating of at least one of the underlayers 141. For different values of overlay, the +1 and −1 diffraction orders captured on the pupil image by imaging detector 111 have sensitivity to overlay in two directions (e.g., $\Delta X$ is the x-direction and $\Delta Y$ in the y-direction). In one embodiment, the nominal offset between gratings 141 and 142 is approximately 150 nanometers in both x and y directions. As described hereinbefore, typical targets are SCOL or DBO targets having two or more cells per overlay direction. As depicted in FIG. 8, metrology target 140 is a single cell target having sensitivity in two orthogonal directions. By collecting signals from one cell instead of four, a significant reduction in move-acquire-measure (MAM) time is achieved.

In a further aspect, a single cell metrology target includes an array of grating structures having two or more different periodicities in at least one direction. For example, the gratings of top layer 142 and the gratings of underlayer 141 may be segmented with a smaller (e.g., design rule) pitch grating or device like structures.

Figure 9:
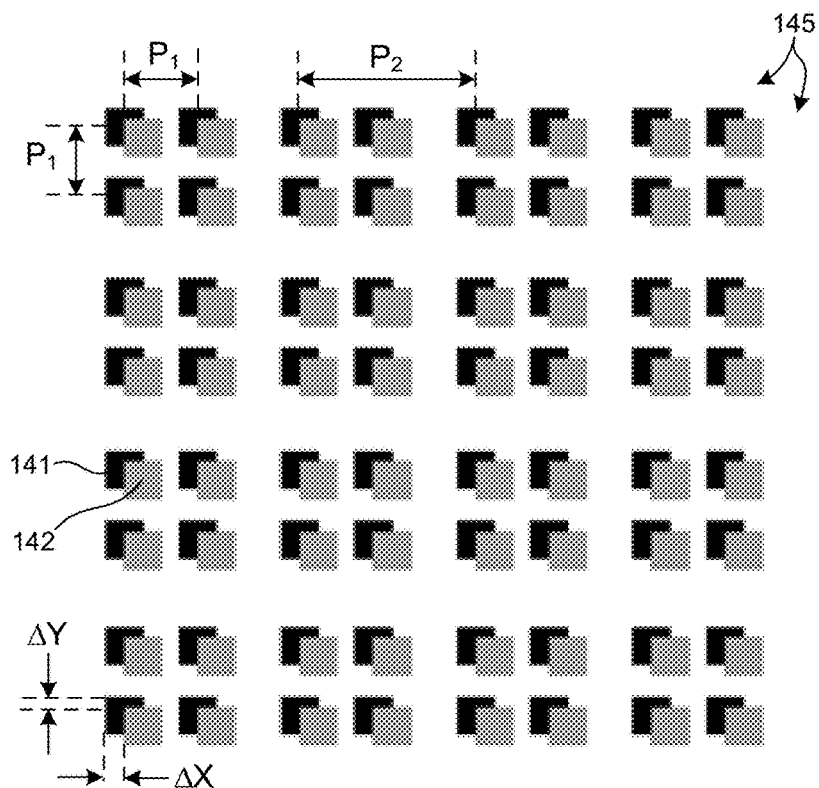
FIG. 9 depicts an illustration of a single cell overlay metrology target in another embodiment.

FIG. 9 depicts an illustration of a single cell overlay metrology target 145 in one embodiment. Metrology target 145 includes a grating of the top layer 142 and a grating of at least one of the underlayers 141. For different values of overlay, the +1 and −1 diffraction orders captured on the pupil image by imaging detector 111 have sensitivity to overlay in two directions (e.g., ΔX is the x-direction and ΔY in the y-direction). Furthermore, metrology target 145 includes a multiple pitch pattern in both directions. The multiple pitch pattern provides additional patterns on the pupil image and enhances the pupil image area sensitive to overlay changes. As depicted in FIG. 9, the multiple pitch pattern includes a periodicity, $P_1$, in both directions, and another periodicity, $P_2$, in both directions. In one embodiment, P1 is approximately 600 nanometers and P2 is approximately 750 nanometers.

As described hereinbefore, the measurement methods and systems described herein are not constrained to specialized targets. In general, any target that exhibits sensitivity to overlay when measured by the available measurement system may be employed in accordance with the methods and systems described herein.

Figure 7:
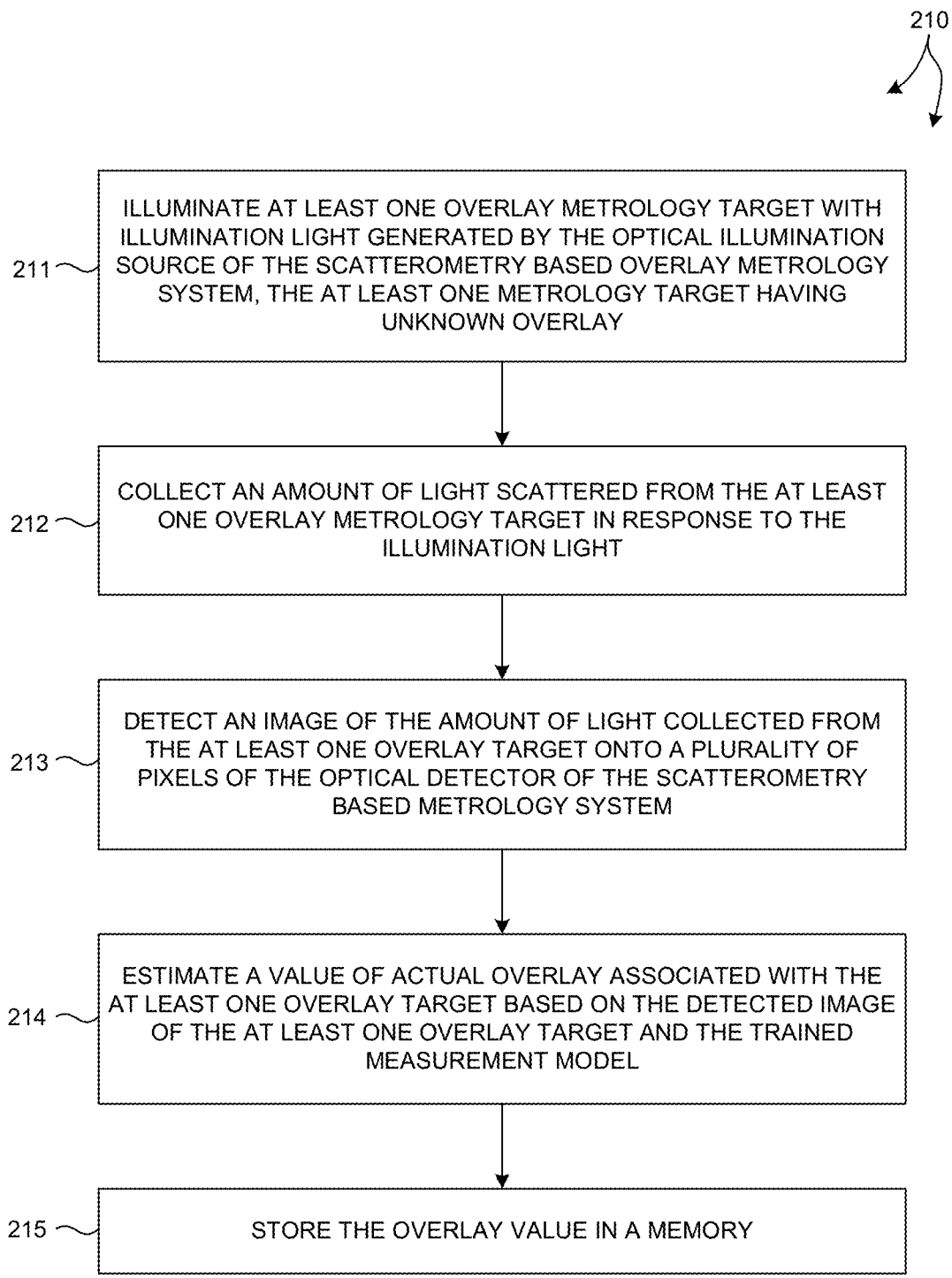
FIG. 7 illustrates a method suitable for implementation by a metrology system such as metrology system 100 illustrated in FIG. 5 of the present invention.

In another aspect, the trained model is employed as the measurement model for measurement of other targets having unknown overlay values. FIG. 7 illustrates a method 210 suitable for implementation by a metrology system such as metrology system 100 illustrated in FIG. 5 of the present invention. In one aspect, it is recognized that data processing blocks of method 210 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 211, at least one overlay metrology target is illuminated with illumination light generated by the optical illumination source (e.g., illuminator 101) of the scatterometry based overlay metrology system employed to generate the training data used to train the measurement model. The measured metrology target(s) have unknown overlay error. Typically, the metrology targets are disposed on a different wafer from the wafer(s) used to generate the training data. The measurements are typically performed at the same or similar process step as the training wafer(s). In addition, the metrology targets disposed on the wafer of interest are typically the same or similar metrology targets as those disposed on the training wafer. However, in some embodiments, metrology targets measured for model training purposes and metrology targets measured for purposes of estimating overlay are disposed on the same wafer.

In block 212, an amount of light scattered from the at least one overlay metrology target in response to the illumination light is collected, for example, by imaging detector 111.

In block 213, an image of the amount of light collected from the at least one overlay target is detected by a plurality of pixels of the optical detector of the scatterometry based metrology system.

In block 214, a value of actual overlay associated with the at least one overlay target is estimated based on the detected image of the at least one overlay target and the trained measurement model. In one example, computing system 130 employs the functional relationship established by training of the measurement model to estimate a value of actual overlay based on the measured scatterometry signals.

In block 215, the estimated overlay is stored in a memory. For example, the overlay values may be stored on-board the measurement system 100, for example, in memory 132, or may be communicated (e.g., via output signal 121) to an external memory device.

In some embodiments, computing system 130 is configured to determine a plurality of principal features of the detected image of the at least one overlay target based on a transformation that reduces a dimension of the image. In these embodiments, the estimation of the value of actual overlay associated with the at least one overlay target is based on the plurality of principal features and the trained measurement model. In some embodiments, the transformation is the same transformation employed to reduce the dimension of the corresponding training data described with reference to method 200. It is preferred to extract features from the scatterometry data using the same analysis employed to extract features from the training data in method 200. In this manner, the dimension reduction of the acquired data is performed by the same transformation used to reduce the dimension of the training data.

In a further aspect, the methods and systems described herein are not limited only to the measurement of overlay errors. In general, the aforementioned scatterometry-based measurement techniques may be applied to the measurement of other process, structure, dispersion parameters, or any combination of these parameters. By way of non-limiting example, profile geometry parameters (e.g., critical dimension), process parameters (e.g., focus, and dose), dispersion parameters, pitch walk, or any combination of parameters may be measured along with overlay error using the aforementioned techniques. A set of training targets with programmed variations for each parameter of interest must be provided. The measurement model is then trained based on scatterometry data collected over measurement sites that include the range of programmed variations of each parameter of interest as described herein with reference to overlay. By way of non-limiting example, a parameter of interest may be a process parameter, a structural parameter, a dispersion parameter, and a layout parameter.

In some examples, the metrology targets measured for purposes of model training are fabricated with different, known values of at least one additional parameter of interest. Thus, the training of the measurement model is also based on the different, known values of the at least one additional parameter of interest and the amount of training data. In some embodiments, the reference values associated with each parameter of interest are obtained using reference metrology such as CD-SEM, XSEM, OCD, etc.

In this manner, a measurement model trained in the manner described herein is usable to estimate values of overlay and additional parameters such as critical dimension, edge placement errors, lithography focus, lithography dosage, and other shape and film parameters of interest. In some embodiments, the estimates of the values of overlay and the parameters of interest may be generated based on measurement data collected from a single cell target, a device structure, or any other target or group of targets that exhibit measurement sensitivity to the parameter of interest. In this manner, estimates of multiple parameters of interest are obtained simultaneously based on one measurement of one or more cells.

In another further aspect, the methods and systems for training the measurement model include an optimization algorithm to automate any or all of the elements required to arrive at a trained measurement model.

In some examples, an optimization algorithm is configured to maximize the performance of the measurement (defined by a cost function) by optimizing any or all of the following parameters: the type of feature extraction model (i.e., transformation), the parameters of the selected feature extraction model, the type of measurement model, the parameters of the selected measurement model. The optimization algorithm can include user defined heuristics and can be combination of nested optimizations (e.g., combinatorial and continuous optimization).

In a further aspect, scatterometry data from multiple, different targets are collected for model building, training, and measurement. The use of measurement data associated with multiple targets having different structure, but formed by the same process conditions and programmed overlay values increases the information embedded in the model and reduces the overlay correlation to process or other parameter variations. The additional information embedded in the model allows for a decoupling of information content associated with overlay from information associated with other parameters (e.g., film thicknesses, CD, etc.) that may affect the measured signals in a similar manner. In these examples, the use of training data that includes images of multiple, different targets at one or more measurement sites enables more accurate overlay estimation. In some examples, a mixture of isolated and dense line/space targets is employed to decouple overlay from underlayer effects.

In another further aspect, signals from multiple targets can be processed to reduce sensitivity to process variations and increase sensitivity to the parameters of interest. In some examples, signals from different targets are subtracted from one another. In some other examples, signals from different targets are fit to a model, and the residuals are used to build, train, and use the measurement model as described herein. In one example, signals from two different targets are subtracted to eliminate, or significantly reduce, the effect of process noise in each measurement result. In general, various mathematical operations can be applied between the signals from different targets to determine signals with reduced sensitivity to process variations and increased sensitivity to the parameters of interest.

In another further aspect, measurement data derived from measurements performed at multiple values of one or more measurement system parameters are collected for model building, training, and measurement. By way of non-limiting example, measurements performed at multiple illumination wavelengths, polarizations, etc., are employed to train a measurement model and perform measurements using the trained measurement model as described herein.

In another further aspect, measurement data derived from measurements performed by a combination of multiple, different measurement techniques is collected for model building, training, and measurement. The use of measurement data associated with multiple, different measurement techniques increases the information content in the combined set of signals and reduces the overlay correlation to process or other parameters variations. Measurement data may be derived from measurements performed by any combination of multiple, different measurement techniques. In this manner, different measurement sites may be measured by multiple, different measurement techniques (e.g., scatterometry, imaging, and other sources of signal information) to enhance the measurement information available for estimation of parameters of interest.

In general, any measurement technique, or combination of two or more measurement techniques may be contemplated within the scope of this patent document as the data processed by the feature extraction model and the measurement model for training and measurement is in vector form. Because the techniques as described herein operate on vectors of data, each collected signal is treated independently. In addition, it is possible to concatenate data from multiple, different metrologies, regardless of whether the data is two dimensional data, one dimensional data, or even single point data.

Exemplary measurement techniques that may provide data for analysis in accordance with the metrology techniques described herein include, but are not limited to, an imaging reflectometer, an imaging spectroscopic reflectometer, a polarized spectroscopic imaging reflectometer, a scanning reflectometer system, a system with two or more reflectometers capable of parallel data acquisition, a system with two or more spectroscopic reflectometers capable of parallel data acquisition, a system with two or more polarized spectroscopic reflectometers capable of parallel data acquisition, a system with two or more polarized spectroscopic reflectometers capable of serial data acquisition without moving the wafer stage or moving any optical elements or the reflectometer stage, imaging spectrometers, imaging system with wavelength filter, imaging system with long-pass wavelength filter, imaging system with short-pass wavelength filter, imaging system without wavelength filter, interferometric imaging system, imaging ellipsometer, imaging spectroscopic ellipsometer, a scanning ellipsometer system, a system with two or more ellipsometers capable of parallel data acquisition, a system with two or more ellipsometers capable of serial data acquisition without moving the wafer stage or moving any optical elements or the ellipsometer stage, a Michelson interferometer, a Mach-Zehnder interferometer, a Sagnac interferometer, a scanning angle of incidence system, and a scanning azimuth angle system. Furthermore, in general, measurement data collected by different measurement technologies and analyzed in accordance with the methods described herein may be collected from multiple tools, rather than one tool integrating multiple technologies.

In another further aspect, signals measured by multiple metrologies can be processed to reduce sensitivity to process variations and increase sensitivity to the parameters of interest. In some examples, signals from targets measured by different metrologies are subtracted from one another. In some other examples, signals from targets measured by different metrologies are fit to a model, and the residuals are used to build, train, and use the measurement model as described herein. In one example, signals from a target measured by two different metrologies are subtracted to eliminate, or significantly reduce, the effect of process noise in each measurement result. In general, various mathematical operations can be applied between the signals measured by different metrologies to determine signals with reduced sensitivity to process variations and increased sensitivity to the parameters of interest.

In general, signals from multiple targets each measured by multiple metrology techniques increases the information content in the combined set of signals and reduces the overlay correlation to process or structural parameter variations.

In some examples, the model building, training, and measurement methods described herein are implemented as an element of a SpectraShape® optical critical-dimension metrology system available from KLA-Tencor Corporation, Milpitas, Calif., USA. In this manner, the model is created and ready for use immediately after the DOE wafer spectra are collected by the system.

In some other examples, the model building and training methods described herein are implemented off-line, for example, by a computing system implementing AcuShape® software available from KLA-Tencor Corporation, Milpitas, Calif., USA. The resulting, trained model may be incorporated as an element of an AcuShape® library that is accessible by a metrology system performing measurements.

In another further aspect, the metrology system employed to perform overlay measurements as described herein (e.g., metrology system 300) includes an infrared optical measurement system. In these embodiments, the metrology system 300 includes an infrared light source (e.g., an arc lamp, an electrode-less lamp, a laser sustained plasma (LSP) source, or a supercontinuum source). An infrared supercontinuum laser source is preferred over a traditional lamp source because of the higher achievable power and brightness in the infrared region of the light spectrum. In some examples, the power provided by the supercontinuum laser enables measurements of overlay structures with opaque film layers.

A potential problem in overlay measurement is insufficient light penetration to the bottom grating. In many examples, there are non-transparent (i.e., opaque) film layers between the top and the bottom gratings. Examples of such opaque film layers include amorphous carbon, tungsten silicide ($WSI_x$), tungsten, titanium nitride, amorphous silicon, and other metal and non-metal layers. Often, illumination light limited to wavelengths in the visible range and below (e.g., between 250 nm and 700 nm) does not penetrate to the bottom grating. However, illumination light in the infrared spectrum and above (e.g., greater than 700 nm) often penetrates opaque layers more effectively.

An effective target design or measurement structure propagates a non-zero diffraction order between the first pattern and the second pattern such that the relative positions of the two patterns affect the intensity of the out-going diffraction beam detected in the far field.

An operational definition of "opaque" in the ultra-violet and visible range is that the predicted precision for SCOL in the wavelength range of 250-700 nm is much worse than the required precision. This is due to attenuation of the propagating diffraction order carrying the relative position information between the first pattern and the second pattern. Measuring SCOL signals with illumination wavelengths greater than 700 nanometers (e.g., 800-1650 nm) improves SCOL precision when absorption is significantly less. In embodiments where illumination light having wavelengths greater than 700 nanometers is employed, the design pitch of the measurement target is selected such that there is usable SCOL signal.

In some of the embodiments described herein, training data is generated by measuring pixels of pupil images of a plurality of metrology targets measured by a SCOL metrology system. However, in general, training data may also be generated by measuring pixels of field images of a plurality of metrology targets measured by an diffraction based overlay (DBO) metrology system, signals generated by an imaging IBO metrology system, signals generated by an X-ray metrology system, signals generated by a spectroscopic ellipsometer (SE) system, etc.

In yet another aspect, the measurement model results described herein can be used to provide active feedback to a process tool (e.g., lithography tool, etch tool, deposition tool, etc.). For example, values of overlay error determined using the methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively.

In general, the systems and methods described herein can be implemented as part of the process of preparing a measurement model for off-line or on-tool measurement. In addition, both measurement models and any reparameterized measurement model may describe one or more target structures and measurement sites.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A scatterometry based metrology system comprising:
    an illumination source configured to provide a first amount of illumination light and a second amount of illumination light to a plurality of overlay metrology targets, wherein the plurality of metrology targets are fabricated with different, known, programmed overlay values and different, known values of at least one fabrication process variable;
    a detector configured to detect an image of an amount of light scattered from each of the plurality of overlay targets in response to the first amount of illumination light and detect a plurality of signals indicative of an amount of light scattered from each of the plurality of overlay targets in response to the second amount of illumination light, the image detected by a plurality of pixels of the detector, the detected image pixels comprising an amount of training data; and
    a computing system configured to:
        estimate a value of actual overlay associated with each of the plurality of overlay metrology targets, wherein the estimating of the value of actual overlay associated with each of the plurality of overlay metrology targets is based on the detected signals indicative of the amount of light scattered from each of the plurality of overlay targets in response to the second amount of illumination light; and
        train a measurement model based on the estimated values of actual overlay and the amount of training data.

2. The scatterometry based metrology system of claim 1, wherein the detector is located at or near a pupil image plane of the scatterometry based metrology system.

3. The scatterometry based metrology system of claim 1, wherein the measurement model is any of a linear model, a polynomial model, a neural network model, a support vector machines model, a decision tree model, and a random forest model.

4. The scatterometry based metrology system of claim 1, wherein the amount of training data includes a combination of scatterometry measurements of at least two different metrology targets of the plurality of overlay metrology targets formed by the same process conditions and programmed overlay values.

5. The scatterometry based metrology system of claim 1, wherein the amount of training data includes scatterometry measurements acquired by a plurality of different metrology techniques.

6. The scatterometry based metrology system of claim 1, wherein the plurality of overlay metrology targets are disposed on a plurality of semiconductor wafers, wherein each of the plurality of semiconductor wafers are processed with a different value of at least one semiconductor fabrication process variable.

7. The scatterometry based metrology system of claim 1, wherein the plurality of overlay metrology targets are disposed on a plurality of fields of one or more semiconductor wafers.

8. The scatterometry based metrology system of claim 1, wherein the providing the amount of illumination light and the detecting of the image of the amount of light scattered from each of the plurality of overlay targets are performed at a plurality of different values of one or more measurement system parameters.

9. The scatterometry based metrology system of claim 1, wherein at least one of the metrology targets is a single cell metrology target having an array of grating structures having periodicity in at least one direction.

10. The scatterometry based metrology system of claim 1, wherein at least one of the metrology targets is a single cell metrology target having an array of grating structures having periodicity in at least two directions.

11. The scatterometry based metrology system of claim 1, wherein at least one of the metrology targets is a single cell metrology target having an array of grating structures having two or more different periodicities in at least one direction.

12. The scatterometry based metrology system of claim 1, wherein the estimating of the value of actual overlay associated with each of the plurality of overlay metrology targets is based on the programmed overlay value.

13. The scatterometry based metrology system of claim 1, wherein the estimating of the value of actual overlay associated with each of the plurality of overlay metrology targets is based on a measurement of the each of plurality of overlay metrology targets by a reference metrology system.

14. The scatterometry based metrology system of claim 13, wherein the reference metrology system is a scanning electron microscope (SEM).

15. The scatterometry based metrology system of claim 1, wherein the computing system is further configured to:
determine a plurality of principal features of the amount of training data based on a transformation of the amount of training data that reduces a dimension of the training data, wherein the training of the measurement model is based on the plurality of principal features extracted from the amount of training data and the estimated values of actual overlay.

16. The scatterometry based metrology system of claim 15, wherein the transformation of the amount of training data involves any of a principal component analysis (PCA), an independent component analysis (ICA), a kernel PCA, a non-linear PCA, a fast Fourier transform (FFT) analysis, a discrete cosine transform (DCT) analysis, and a wavelet analysis.

17. The scatterometry based metrology system of claim 1, wherein the training of the measurement model is also based on the different, known values of the at least one fabrication process variable and the amount of training data.

18. The scatterometry based metrology system of claim 17, wherein the plurality of metrology targets are also fabricated with different, known values of at least one additional parameter of interest, and wherein the training of the measurement model is also based on the different, known values of the at least one additional parameter of interest and the amount of training data.

19. The scatterometry based metrology system of claim 18, wherein the at least one additional parameter of interest includes any of a process parameter, a structural parameter, a dispersion parameter, and a layout parameter.

20. The scatterometry based metrology system of claim 1, wherein the illumination source is further configured to illuminate at least one overlay metrology target having unknown overlay error, wherein the detector is further configured to detect an image of an amount of light scattered from the at least one overlay target, and wherein the computing system is further configured to estimate a value of actual overlay associated with the at least one overlay target based on the detected image of the at least one overlay target and the trained measurement model.

21. The scatterometry based metrology system of claim 20, wherein the computing system is further configured to determine a plurality of principal features of the image of the at least one overlay target based on a transformation that reduces a dimension of the image, wherein the estimating of the value of actual overlay associated with the at least one overlay target is based on the plurality of principal features and the trained measurement model.

22. The scatterometry based metrology system of claim 20, wherein a value of a lithography process variable is adjusted based on the estimated value of actual overlay.

23. A scatterometry based metrology system comprising:
an illumination source configured to provide an amount of illumination light to each of a plurality of overlay metrology targets at a plurality of different illumination wavelengths;
a detector configured to detect an image of an amount of light scattered from each overlay metrology target at each different illumination wavelength onto a plurality of pixels of the detector, wherein the amount of scattered light includes +1 and −1 diffraction orders; and
a computing system configured to:
estimate a first value of actual overlay based on differences between the +1 and −1 diffraction orders for each different illumination wavelength;
determine a peak value of actual overlay from the first values of actual overlay associated with the different illumination wavelengths;
determine a difference in wavelength from the wavelength associated with the peak value that minimizes within-wafer overlay variation, the determined difference in wavelength being a distance from the peak value; and
estimate a second value of actual overlay based on the measurement of overlay at the distance from the peak value.

24. A method comprising:
illuminating each of a plurality of overlay metrology targets with a first amount of illumination light generated by an optical illumination source of a scatterometry based overlay metrology system, wherein the plurality of metrology targets are fabricated with different, known, programmed overlay values and different, known values of at least one fabrication process variable;
collecting a first amount of light scattered from each of the plurality of overlay metrology targets in response to the first amount of illumination light;
detecting an image of the first amount of light collected from each of the plurality of overlay targets onto a plurality of pixels of an optical detector of the scatterometry based metrology system, the detected image pixels comprising an amount of training data;
illuminating each of the plurality of overlay metrology targets with a second amount of illumination light generated by the optical illumination source of the scatterometry based overlay metrology system;
collecting a second amount of light scattered from each of the plurality of overlay metrology targets in response to the second amount of illumination light;
detecting a plurality of signals indicative of the second amount of light collected from each of the plurality of overlay targets onto the optical detector of the scatterometry based metrology system;
estimating a value of actual overlay associated with each of the plurality of overlay metrology targets, wherein the estimating of the value of actual overlay associated with each of the plurality of overlay metrology targets is based on the plurality of signals indicative of the amount of light scattered from each of the plurality of overlay targets in response to the second amount of illumination light; and
training a measurement model based on the estimated values of actual overlay and the amount of training data.

25. The method of claim 24, wherein the detector is located at or near a pupil image plane of the scatterometry based metrology system.

26. The method of claim 24, wherein the training of the measurement model is also based on the different, known values of the at least one fabrication process variable and the amount of training data, wherein the plurality of metrology targets are also fabricated with different, known values of at least one additional parameter of interest, and wherein the training of the measurement model is also based on the different, known values of the at least one additional parameter of interest and the amount of training data.

27. The method of claim 24, wherein at least one of the metrology targets is a single cell metrology target having an array of grating structures having periodicity in at least one direction.

28. The method of claim 24, wherein at least one of the metrology targets is a single cell metrology target having an array of grating structures having periodicity in at least two directions.

29. The method of claim 24, wherein at least one of the metrology targets is a single cell metrology target having an array of grating structures having two or more different periodicities in at least one direction.

30. The method of claim 24, wherein the second amount of illumination light includes a plurality of different illumination wavelengths, wherein the second amount of light scattered from each of the plurality of overlay metrology targets includes +1 and −1 diffraction orders, wherein the plurality of detected signals is indicative of the second amount of light collected from each of the plurality of overlay targets at each different illumination wavelength, and wherein the estimating of the actual overlay involves:
   estimating a first value of actual overlay based on differences between the +1 and −1 diffraction orders for each different illumination wavelength;
   determining a peak value of actual overlay from the first values of actual overlay associated with the different illumination wavelengths;
   determining a difference in wavelength from the wavelength associated with the peak value that minimizes within-wafer overlay variation, the determined difference in wavelength being a distance from the peak value; and
   estimating a second value of actual overlay based on the measurement of overlay at the distance from the peak value.

31. The method of claim 24, further comprising:
   illuminating at least one overlay metrology target with illumination light generated by the optical illumination source of the scatterometry based overlay metrology system, the at least one metrology target having unknown overlay error;
   collecting an amount of light scattered from the at least one overlay metrology target in response to the illumination light;
   detecting an image of the amount of light collected from the at least one overlay target onto a plurality of pixels of the optical detector of the scatterometry based metrology system;
   estimating a value of actual overlay associated with the at least one overlay target based on the detected image of the at least one overlay target and the trained measurement model; and
   storing the overlay value in a memory.

32. The method of claim 31, further comprising:
   adjusting a value of a lithography process variable based on the estimated value of actual overlay.

* * * * *